(12) United States Patent
Saigoh et al.

(10) Patent No.: US 6,777,736 B2
(45) Date of Patent: Aug. 17, 2004

(54) SEMICONDUCTOR DEVICE AND METHOD OF MANUFACTURING THE SAME

(75) Inventors: Kaoru Saigoh, Kawasaki (JP); Hisashi Miyazawa, Kawasaki (JP); Hirokazu Yamazaki, Kawasaki (JP); Hideaki Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/971,737

(22) Filed: Oct. 9, 2001

(65) Prior Publication Data

US 2002/0130345 A1 Sep. 19, 2002

(30) Foreign Application Priority Data

Mar. 14, 2001 (JP) ........................................ 2001-071791

(51) Int. Cl.[7] ...................... H01L 27/108; H01L 29/76; H01L 29/94; H01L 31/119
(52) U.S. Cl. ...................... 257/300; 257/295; 257/296; 257/306; 257/307; 257/308; 257/309
(58) Field of Search .............................. 257/300, 306, 257/307–309, 295–296

(56) References Cited

U.S. PATENT DOCUMENTS

| | | | | |
|---|---|---|---|---|
| 4,651,183 A | * | 3/1987 | Lange et al. ................ | 257/296 |
| 4,709,351 A | * | 11/1987 | Kajigaya ..................... | 365/51 |
| 5,309,392 A | * | 5/1994 | Ootsuka et al. ............. | 365/145 |
| 5,900,661 A | * | 5/1999 | Sato ........................... | 257/315 |
| 6,020,612 A | * | 2/2000 | Sawamura et al. ......... | 257/341 |
| 6,121,086 A | * | 9/2000 | Kuroda et al. .............. | 438/256 |
| 6,137,218 A | * | 10/2000 | Kaneko et al. ............. | 313/495 |
| 6,151,243 A | * | 11/2000 | Kim ........................... | 365/145 |
| 6,163,043 A | * | 12/2000 | Hirano et al. ............... | 257/296 |
| 6,525,350 B1 | * | 2/2003 | Kinoshita et al. ........... | 257/202 |
| 2001/0038115 A1 | * | 11/2001 | Amanuma ................... | 257/303 |
| 2001/0051414 A1 | * | 12/2001 | Kanaya et al. ............. | 438/386 |
| 2002/0011615 A1 | * | 1/2002 | Nagata et al. .............. | 257/295 |
| 2002/0040988 A1 | * | 4/2002 | Hidaka et al. .............. | 257/296 |
| 2002/0043677 A1 | * | 4/2002 | Jung .......................... | 257/295 |
| 2002/0130345 A1 | * | 9/2002 | Saigoh et al. ............... | 257/300 |

OTHER PUBLICATIONS

Tatsuya Yamazaki, et al., Advanced 0.5 μm FRAM Device Technology with Full Compatibility of Half–Micron CMOS Logic device, 1997 IEEE.

* cited by examiner

*Primary Examiner*—Amir Zarabian
*Assistant Examiner*—Ida M. Soward
(74) *Attorney, Agent, or Firm*—Westerman, Hattori, Daniels & Adrian, LLP

(57) ABSTRACT

The semiconductor device having the capacitor comprises a plurality of switching elements formed on a semiconductor substrate 1 at a distance, a plurality of capacitors formed in areas between a plurality of switching elements formed in the first direction respectively and each having a lower electrode, a dielectric film and an upper electrode, first wirings for connecting the upper electrodes of the capacitors and the switching elements in the first direction on a one-by-one base, and second wirings formed over a part of the first wirings, the switching elements, and the capacitors to extend in the second direction that intersects with the first direction. Accordingly, the higher speed operation than the prior art can be achieved.

16 Claims, 24 Drawing Sheets

2T2C

1T1C

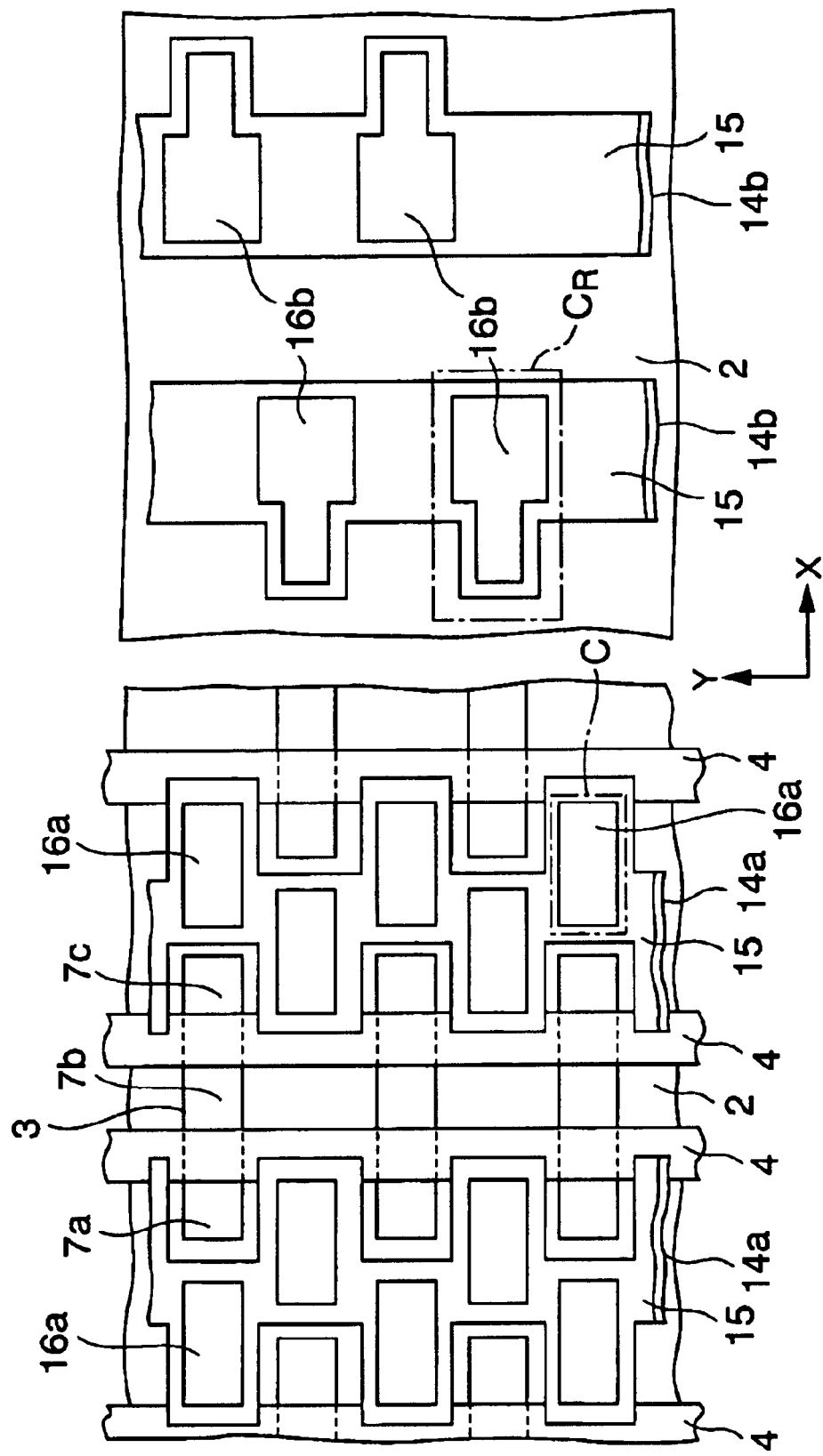

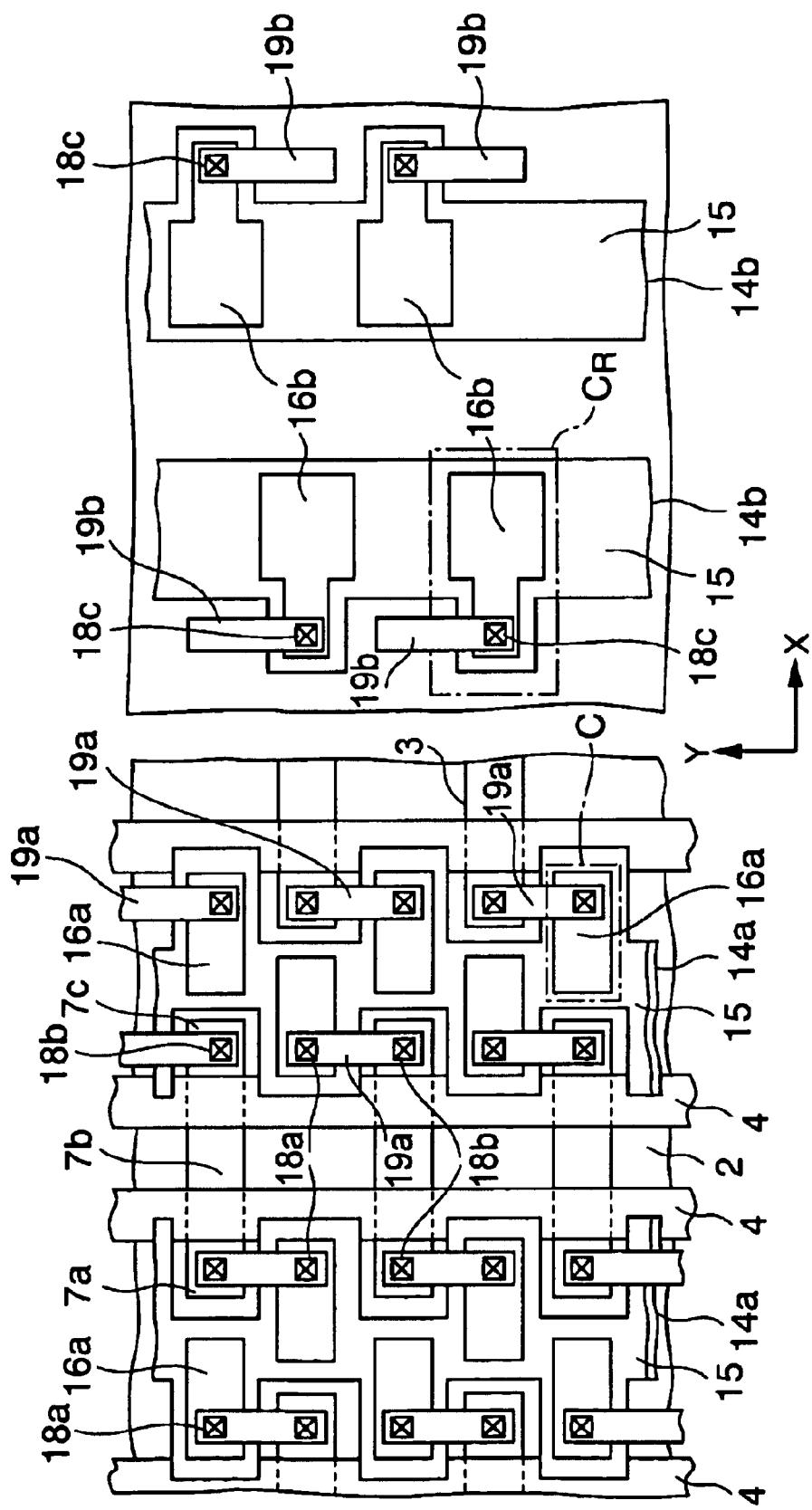

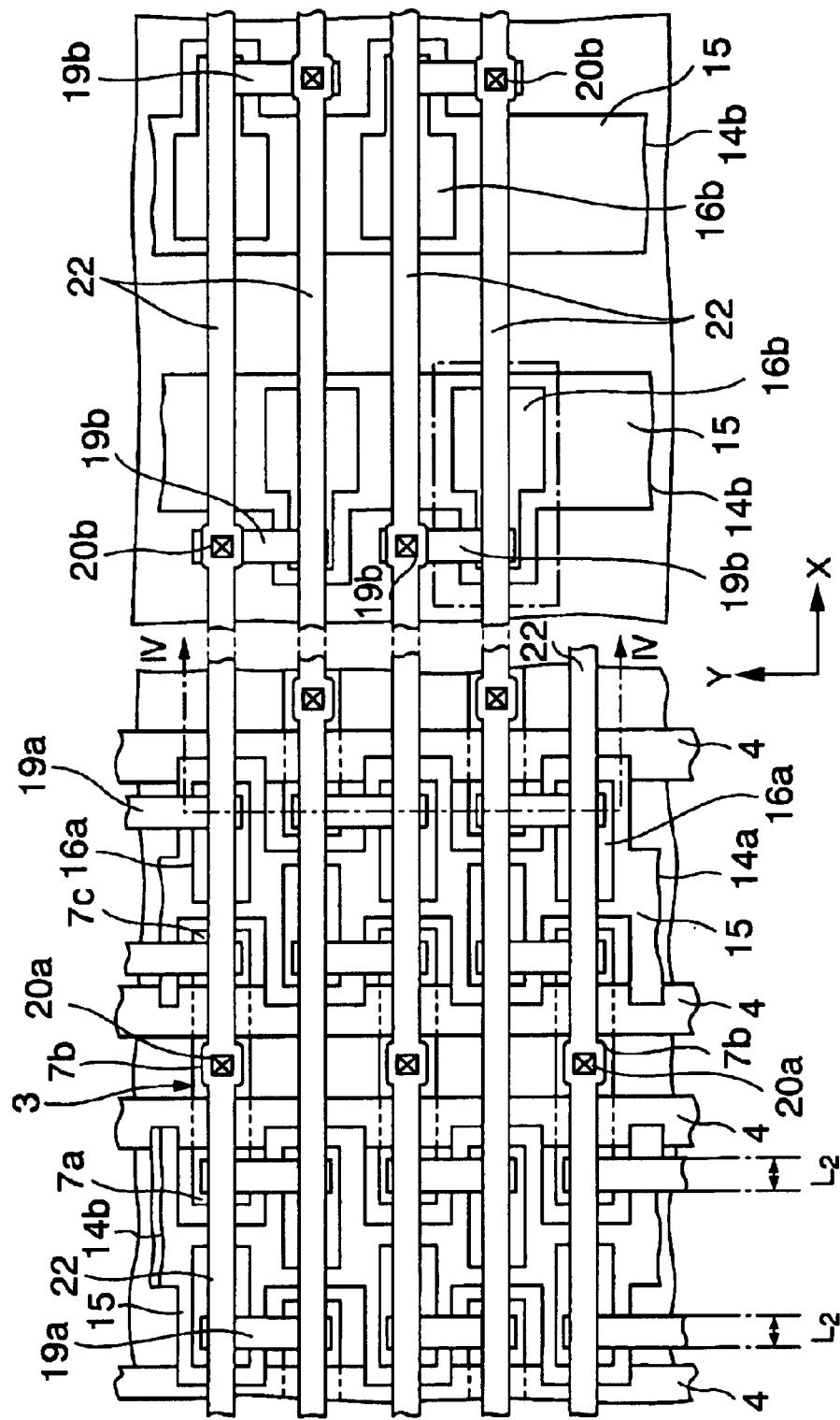

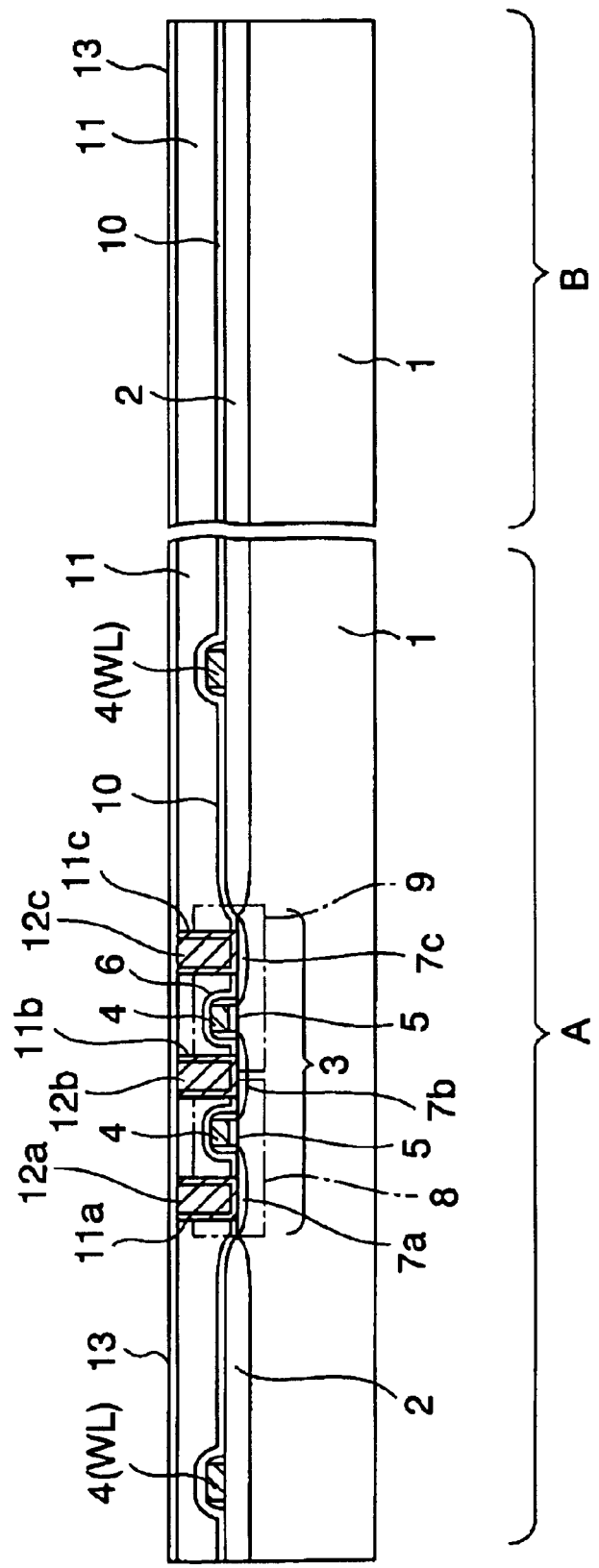

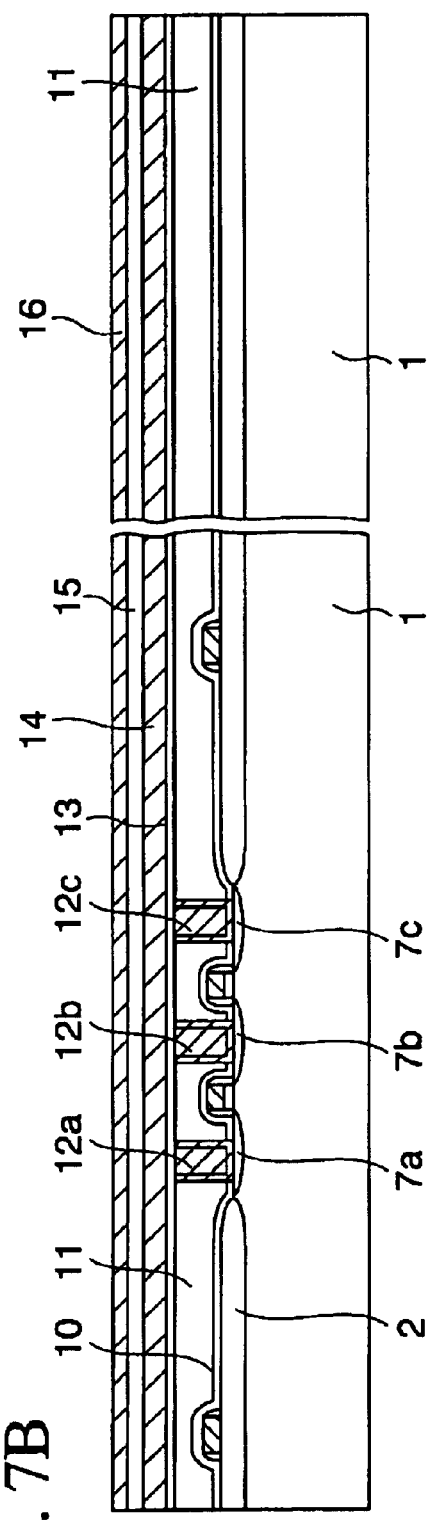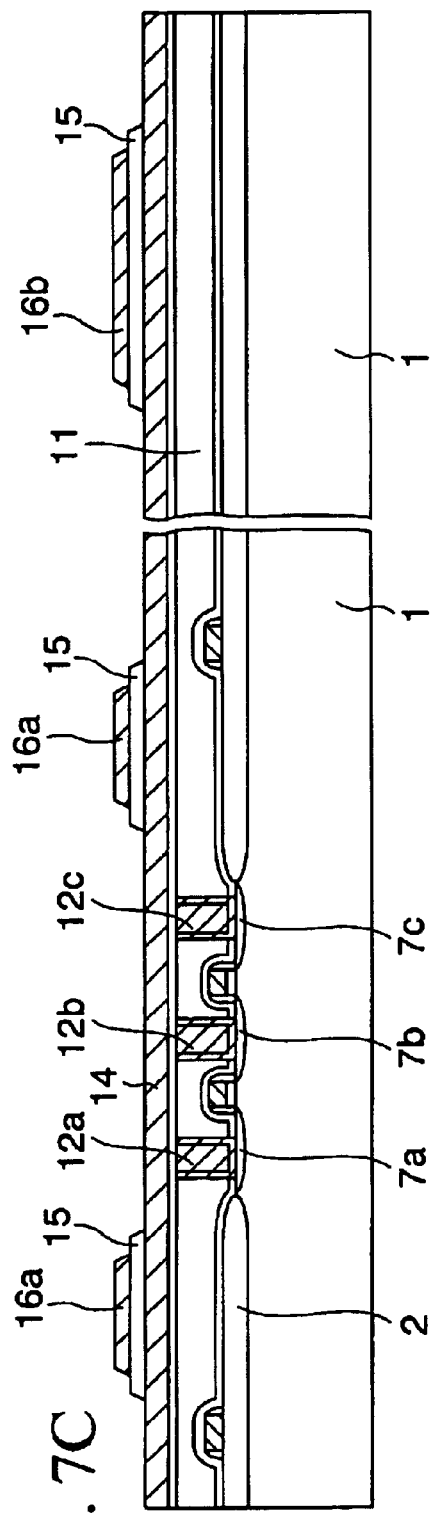

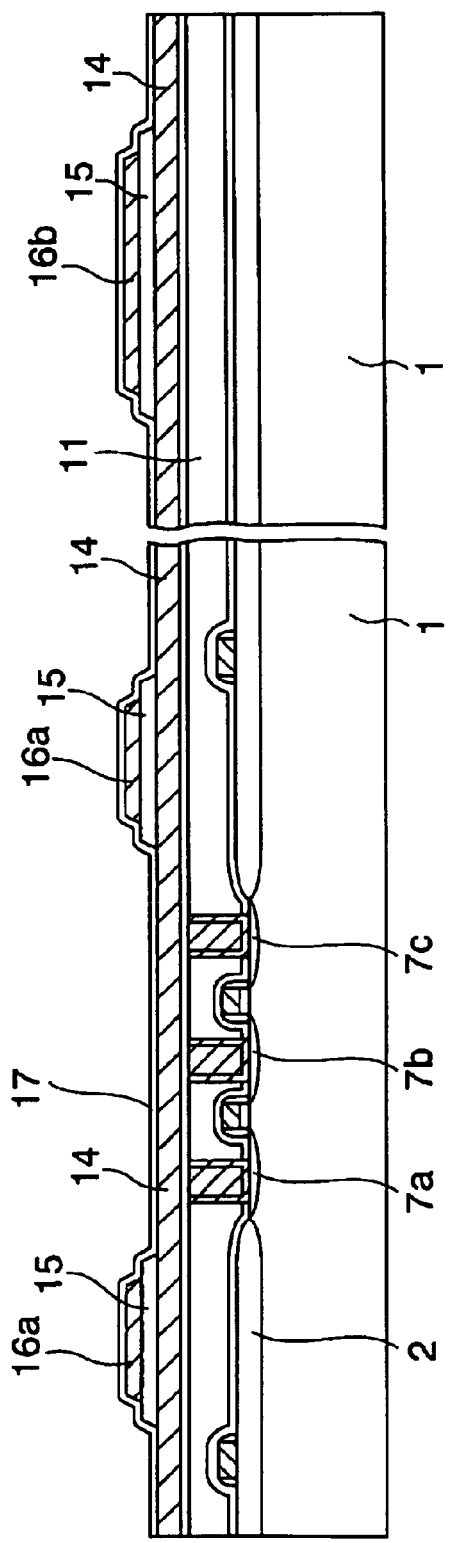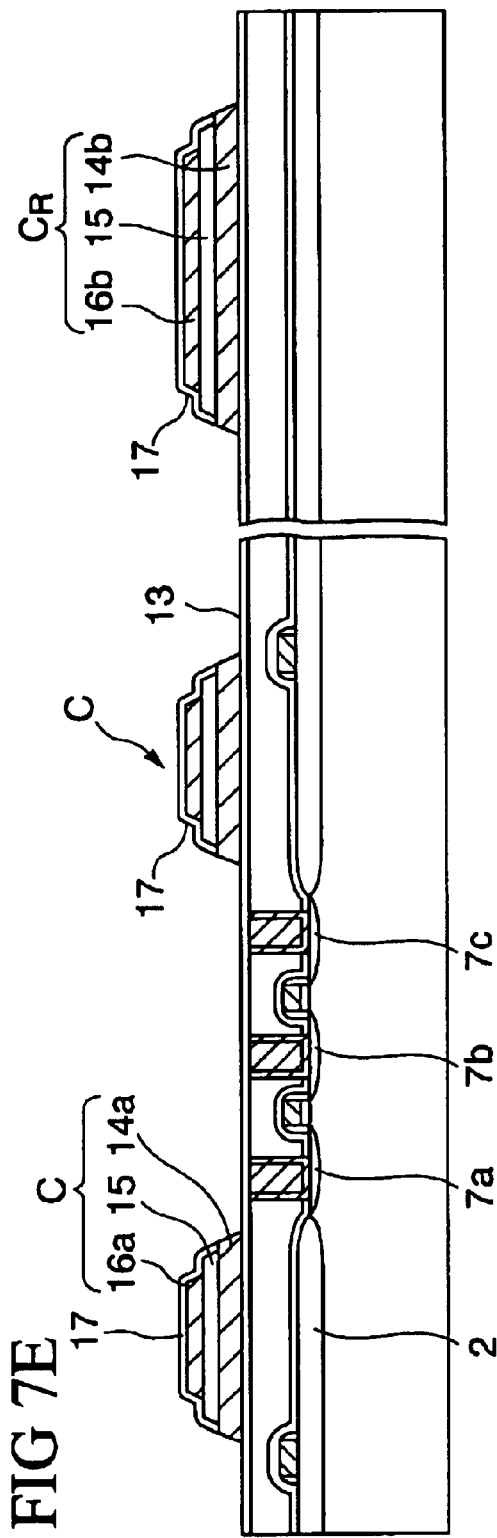

SEMICONDUCTOR DEVICE AND METHOD OF MANUFACTURING THE SAME

CROSS-REFERENCE TO RELATED APPLICATIONS

This application is based upon and claims priority of Japanese Patent Application No. 2001-71791, filed in Mar. 14, 2001, the contents being incorporated herein by reference.

BACKGROUND OF THE INVENTION

1. Field of the Invention

The present invention relates to a semiconductor device and a method of manufacturing the same and, more particularly, a semiconductor device having a capacitor and a method of manufacturing the same.

2. Description of the Prior Art

As one of the nonvolatile memory that can store the information after the power supply is turned off, there is known the FeRAM (Ferroelectric Random Access Memory) having the ferroelectric material. The FeRAM has the structure that can store the information by utilizing the hysteresis characteristic of the ferroelectric material, and permits the high speed operation, and has the low power consumption. Thus, the future development of the FeRAM is anticipated as the nonvolatile memory that permits the large number of times of the writing operation.

FIGS. 1A and 1B show an example of a circuit diagram of an FeRAM memory cell respectively.

FIG. 1A show an example of a circuit diagram of the type in which two transistors $T_{11}$, $T_{12}$ and two capacitors $C_{11}$, $C_{12}$ are employed to store one-bit information (referred to as a "2T2C type" hereinafter). The 2T2C type FeRAM memory cell executes an complementary operation to store "1" or "0" data into one capacitor and store the opposite data into the other capacitor. At the time of decision of the data, polarization states of both capacitors C11, C12 are read, and then the data decision is carried out by using difference between them.

FIG. 1B is a circuit diagram of the type in which one transistor $T_o$ and one capacitor $C_o$ are employed to store one-bit information (referred to as a "1T1C type" hereinafter). The 1T1C type employs one transistor and one capacitor for one-bit information. Also, the 1T1C type needs the reference capacitor $C_1$ that generates the reference voltage to decide that the charge read from the memory cell is the data of "1" or the data of "0". The polarization of the reference capacitor $C_1$ is inverted every time when the data is read out. The decision of data is executed based on the large or small relationship between the potential of the capacitor $C_o$ of each memory cell and the potential of the reference capacitor $C_1$. The reference capacitor $C_1$ is connected to an end portion of each bit line BIT. Ideally, it is desired that the potential of the reference capacitor $C_1$ should be set to an intermediate potential between the voltage $V_1$ at which "1" is written into the memory cell and the voltage $V_0$ at which "0" is written into the memory cell.

The 1T1C type memory cell can reduce a cell area to almost half rather than the 2T2C type FeRAM memory cell. FIG. 2 shows a plan view of a structure in which the arrangement of the 2T2C type memory cell is applied to the 1T1C type memory cell.

In FIG. 2, a plurality of stripe-like capacitor lower electrodes 103 that extend in the Y direction are formed at an interval over a device isolation layer 102 on a semiconductor substrate 101 in the X direction. Then, ferroelectric films 104 each having the almost same shape as the capacitor lower electrode are formed on the capacitor lower electrodes 103. Then, a plurality of capacitor upper electrodes 105 are formed on the ferroelectric films 104 to be aligned in the Y direction. One capacitor $C_o$ consists of the capacitor upper electrode 105, the ferroelectric film 104, and the capacitor lower electrode 103.

Also, a pair of transistors $T_o$ are formed in active regions, that are surrounded by the device isolation layer 102, on both sides of the capacitor upper electrode 105 on the semiconductor substrate 101. Then, a plurality of capacitor upper electrodes 105 formed on the capacitor lower electrodes 103 are connected sequentially to the transistor $T_o$ on one side and the transistor $T_o$ on other side alternatively.

Two transistors $T_o$ are formed in one active region surrounded by the device isolation layer 102. Two gate electrodes 106 that are also used as word lines WL extending in the Y direction are formed in the active region via a gate insulating film (not shown). Impurity diffusion areas 107a, 107b, 107c are formed in the active regions on both sides of two gate electrodes 106.

Bit lines BIT connected to the impurity diffusion area 107b in the center of the active region are formed over the capacitor $C_o$ and the transistor $T_o$ so as to extend in the X direction. Also, the impurity diffusion areas 107a, 107c on both ends of the active region are connected to the capacitor upper electrode 105 via a local-interconnection wiring 108 that is formed below the bit line BIT along the bit line BIT.

In FIG. 2, an interlayer insulating film formed on the semiconductor substrate 101 is omitted.

In FIG. 2, since a plurality of transistors $T_o$ existing in the Y direction are connected to a plurality of capacitor upper electrodes 105 formed on the side of the transistor every other electrode respectively, a wide margin exists between the transistors $T_o$.

Therefore, as shown in FIG. 3, in order to place the capacitor $C_o$ in the area between the transistors $T_o$ existing in the Y direction, it is set forth in Tatsuya Yamazaki et. al, "Advanced 0.5 μm FEAM Device Technology with Full Compatibility of Half-Micron CMOS Logic Device" 1997 IEEE IEDM to form the capacitor upper electrodes 105 in a zigzag fashion. Accordingly, an interval between the transistors $T_o$ in the X direction is narrowed.

FIG. 4A is a sectional view of the memory cell shown in FIG. 3 taken along a I—I line, and FIG. 4B is a sectional view of the reference capacitor connected to the bit line BIT.

In FIG. 4A, the device isolation layer 102 and the transistor $T_o$ on the semiconductor substrate 101 are covered with a first interlayer insulating film 111 and a second interlayer insulating film 112. Holes are formed in the first interlayer insulating film 111 on the impurity diffusion areas 107a, 107b, 107c respectively, and contact plugs 109a, 109b, 109c are buried in these holes respectively. The capacitors $C_o$ are formed on the second interlayer insulating film 112, and a third interlayer insulating film 113 is formed on the capacitors $C_o$. Also, the local-interconnection wirings 108 are formed on the third interlayer insulating film 113. The local-interconnection wirings 108 are connected to the capacitor upper electrode 105 via a hole in the third interlayer insulating film 113 respectively, and also connected to the contact plugs 109a, 109c on the end portions of the active regions via another holes in the second and third interlayer insulating films 112, 113 respectively. Also, the bit line BIT is formed on a fourth interlayer insulating film 114 that covers the local-interconnection wirings 108. The bit line BIT is connected to the contact plug 109b in the center of the active region via a hole that is formed in the first, second, third and fourth interlayer insulating films 111, 112, 113, 114.

In FIG. 4B, a reference capacitor $C_1$ consisting of a lower electrode 115, a ferroelectric film 116, and an upper electrode 117 is formed on the second interlayer insulating film 112 formed over the semiconductor substrate 101. The reference capacitor $C_1$ is covered with the third interlayer insulating film 113. Also, a local-interconnection wiring 118 that is connected to the upper electrode 117 of the reference capacitor $C_1$ via a hole is formed on the third interlayer insulating film 113. This local-interconnection wiring 118 is extended to the outside to pass over the upper electrode 117. Also, the bit line BIT connected to another reference capacitor is formed over the reference capacitor $C_1$ via the fourth interlayer insulating film 114.

By the way, following problems exist in the structures shown in FIG. 3 and FIG. 4.

A first problem is that the parasitic capacitance that is constructed by the bit line BIT and the underlying local-interconnection wiring 108 in the memory cell disturbs the higher speed operation of the FeRAM.

A second problem is that the resist coated on the peripheral portion of the FeRAM chip is ready to thin. For example, as shown in FIG. 5A, if a resist 120 is coated on the fourth interlayer insulating film 114 that covers the reference capacitor $C_o$, there is such a tendency that the resist 120 become thin in the neighborhood 120a of the deeply stepped portion of the reference capacitor $C_o$. If the etching is carried out in such state, the resist 120 is etched to expose a part of the fourth interlayer insulating film 114 and subsequently a part of the fourth interlayer insulating film 114 is etched to expose a part of the leading electrode 118, as shown in FIG. 5B. If the bit line BIT shown in FIG. 4B is formed in this state, there is caused the problem that the short-circuit between the bit line BIT and the leading electrode 118 is caused at the location where they are not essentially connected.

In this case, if the fourth interlayer insulating film 114 is formed thick and then the fourth interlayer insulating film 114 is planarized by the chemical mechanical polishing (CMP) method, the situation that a thickness in the resist 120 is reduced in the peripheral area of the chip can be prevented. However, since the cost-up has already been brought about in the FeRAM by using the noble metal as the capacitor lower electrode 103, etc., it is not preferable to employ the CMP that causes the higher cost.

SUMMARY OF THE INVENTION

It is an object of the present invention to provide a semiconductor device capable of increasing its operation speed higher than the prior art and also preventing the reduction in thickness of resist in a peripheral area of a chip, and a method of manufacturing the same.

According to the present invention, the switching element (transistors) and the capacitor are connected by the first wirings (local-interconnection wirings) that extend in the first direction, and the second wirings (bit lines), that are formed over the switching element and the capacitor, are extended in the second direction that intersects with the first direction.

Therefore, since the extended directions of the first wirings and the second wirings intersect with each other, the opposing area between the first wiring and the second wiring can be reduced rather than the prior art, and also the capacitance formed by the first wiring and the second wiring can be reduced rather than the prior art. As a result, the higher speed operation of the semiconductor device can be attained.

Also, in case a plurality of capacitors exist over and around the switching element and also the wirings are formed over the switching elements by forming the metal film over the switching elements and the capacitors and then patterning this metal film while using the resist, the exposure light that is reflected by the inclined surface of the metal film around the capacitors causes the halation to cause the reduction in width of the resist pattern.

In this case, since the resist coated over the capacitor and the switching element is patterned at the level difference portion of the capacitor not to irradiate the exposure light, the wiring-forming resist pattern over the switching element is extended up to the level difference portion of the capacitor. Therefore, since the halation due to the level difference is hard to occur, the reduction in thickness of the resist pattern can be eliminated and thus the generation of the wiring failure can be prevented.

In addition, according to the present invention, the wiring connected to the upper electrode of the reference capacitor, that is formed in the chip peripheral portion of the semiconductor memory device, is extended to the outside of the reference capacitance in the area where the resist tends to become thin.

Therefore, the level difference under the resist is relaxed to be smooth above the reference capacitor and the outskirts of its, and thus the thinning of the resist caused by the level difference of the reference capacitor is suppressed. As a result, when the insulating film is etched and patterned by using the resist pattern, the situation that the insulating film covered with the resist pattern in the chip peripheral portions are exposed by the etching can be eliminated and in turn the exposure of the wirings under the resist pattern can be prevented.

BRIEF DESCRIPTION OF THE DRAWINGS

FIGS. 6A to 6D are plan views showing steps of forming an FeRAM memory cell and a reference capacitor according to a first embodiment of the present invention;

FIGS. 7A to 7K are sectional views showing steps of forming the FeRAM memory cell and the reference capacitor according to the first embodiment of the present invention;

DESCRIPTION OF THE PREFERRED EMBODIMENTS

Figure 1A:
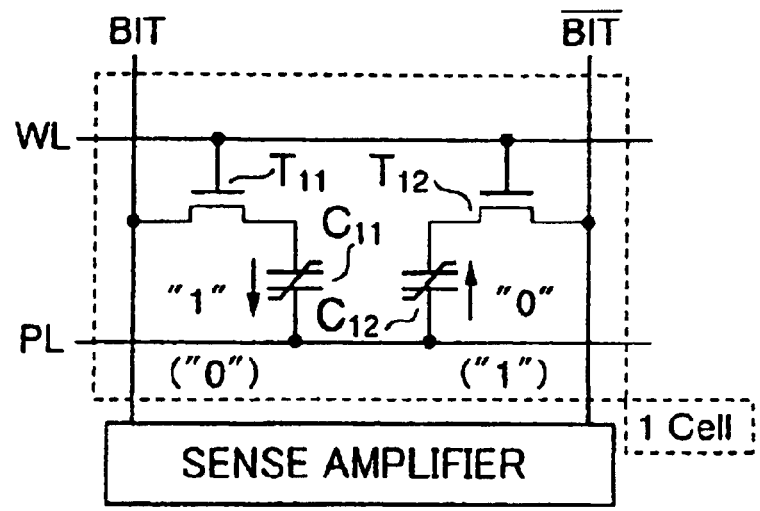
FIGS. 1A and 1B show a circuit diagram of an FeRAM memory cell respectively.
Figure 1B:
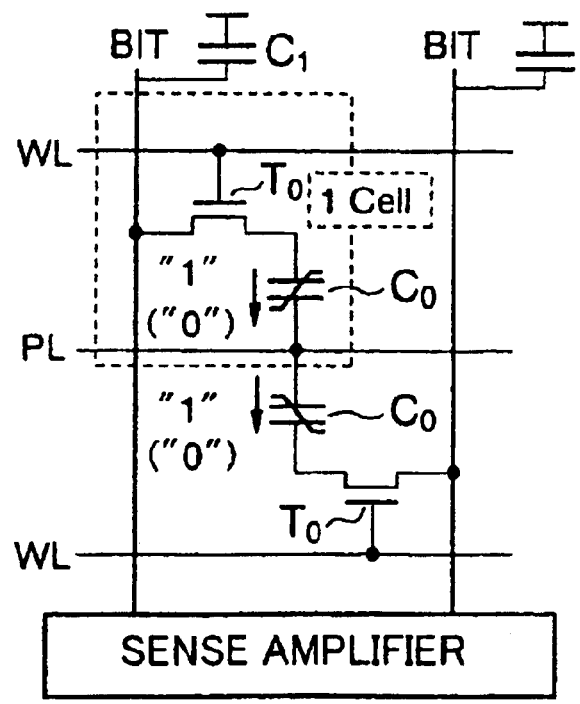
Figure 2:
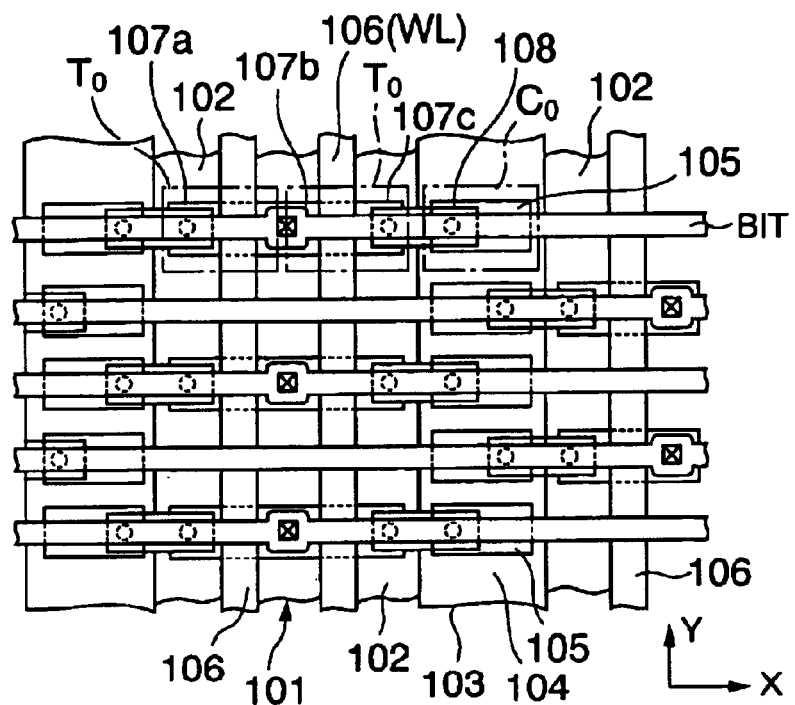
FIG. 2 is a plan view showing a 1T1C type FeRAM memory cell based on a 2T2C type FeRAM memory cell in the prior art.

Embodiments of the present invention will be explained with reference to the accompanying drawings hereinafter.

(First Embodiment)

FIGS. 6A to 6D are plan views showing steps of forming an FeRAM memory cell and a reference capacitor according to a first embodiment of the present invention. FIGS. 7A to 7K are sectional views showing steps of forming the FeRAM memory cell and the reference capacitor. In FIGS. 6A to 6D, an insulating film on the transistor is omitted.

Then, steps required to form structures shown in FIG. 6A and FIG. 7A will be explained hereunder.

First, a device isolation insulating film 2 is formed selectively on a surface of a p-type silicon (semiconductor) substrate 1 by the LOCOS method. As shown in FIG. 6A, the device isolation insulating film 2 is formed in a memory cell area A except a plurality of active regions 3, and also is formed in the overall reference cell area B.

The neighboring active regions 3 in the memory cell area A are arranged such that they are formed at a space in the Y direction and also formed on both sides of the space in the X direction. The X direction and the Y direction are mutually intersecting directions.

Then, as shown in FIG. 7A, two gate electrodes 4 made of polysilicon, amorphous silicon, or tungsten silicide are formed on the active region 3 via a gate insulating film 5. As shown in FIG. 6A, the gate electrode 4 extends in the Y direction and is also used as the word line WL. Also, an interval $L_1$ between the right-side word line WL passing over the active region 3 and the left-side word line WL passing over the active region 3 adjacent to the above active region 3 in the X direction is set to 5.2 μm, for example.

Figure 6A:
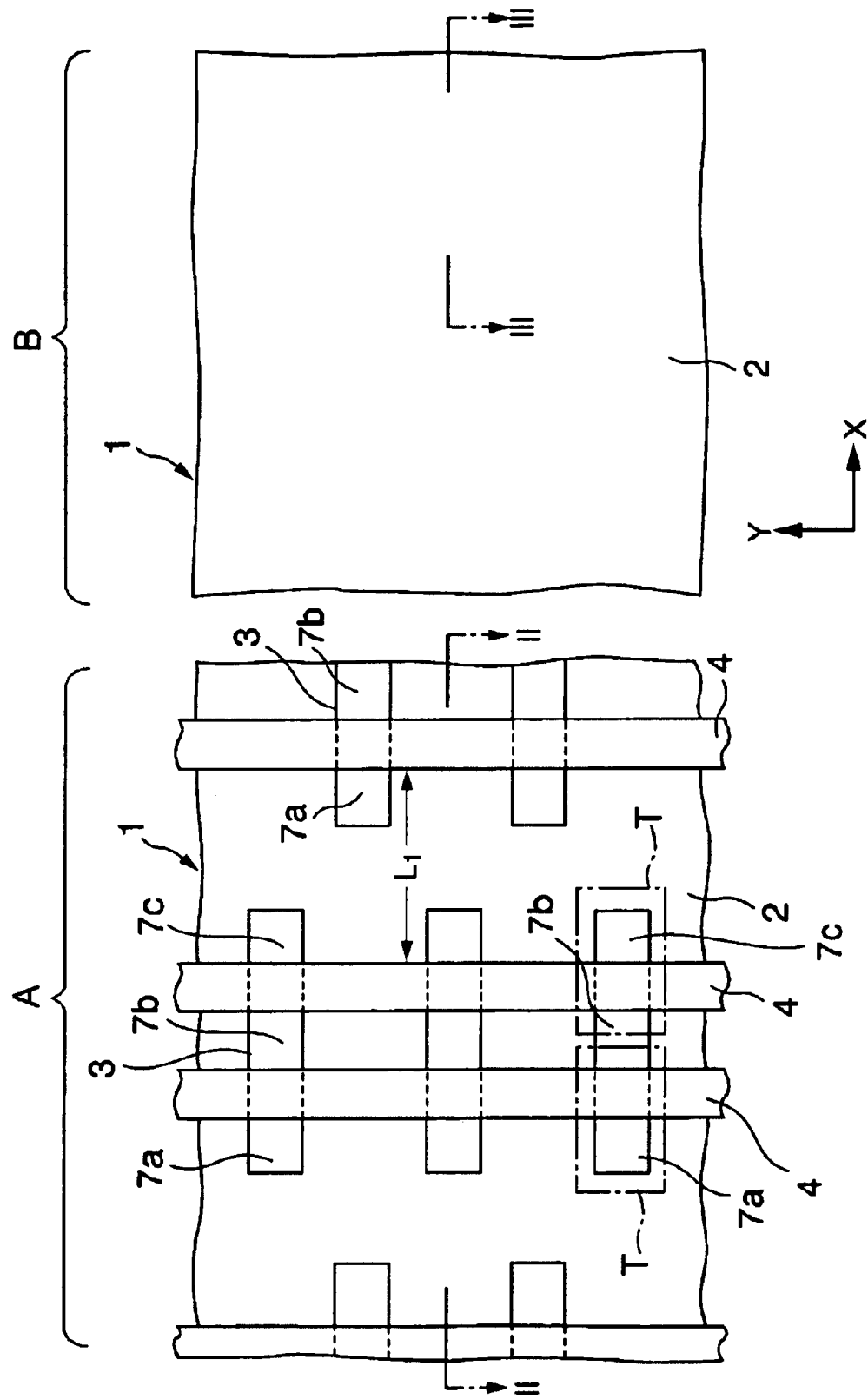

In this case, FIG. 7A shows a sectional shape of the memory cell area taken along a II—II line in FIG. 6A and the reference cell area B taken along a III—III line.

Then, low concentration n-type impurity diffusion layers are formed by ion-implanting the n-type impurity into the active region 3 on both sides of the gate electrode 4. Then, an insulating film, e.g., an $SiO_2$ film, is formed on the entire surface of the silicon substrate 1 by the CVD method, and then the insulating film is left as a sidewall insulating film 6 only on both side portions of the gate electrode 4 by etching back the insulating film. Then, high concentration n-type impurity diffusion layers are formed by ion-implanting again the n-type impurity into the active region 3 while using the gate electrode 4 and the sidewall insulating films 6 as a mask. Accordingly, first, second, and third n-type impurity diffusion layers 7a, 7b, 7c each having the LDD structure consisting of the low concentration n-type impurity diffusion layer and the high concentration n-type impurity diffusion layer are formed on both sides of the gate electrode 4.

According to the above steps, the gate electrodes 4 and two MOS transistors 8, 9 having the n-type impurity diffusion layers 7a, 7b, 7c of the LDD structure are formed in each active region 3.

Next, as shown in FIG. 7A, a silicon oxide nitride (SiON) film of about 200 nm thickness is formed on the entire surface of the silicon substrate 1 by the plasma CVD method as a covering film 10 to cover the MOS transistors 8, 9.

Then, a first interlayer insulating film 11 made of $SiO_2$ and having a thickness of about 1.0 μm is grown on the covering film 10 by the plasma CVD method using the TEOS gas.

Then, as the densifying process of the first interlayer insulating film 11, the first interlayer insulating film 11 is heated at the temperature of about 700° C. for 30 minutes in the normal-pressure nitrogen atmosphere. Then, an upper surface of the first interlayer insulating film 11 is planarized by the chemical mechanical polishing (CMP) method. A thickness of the first interlayer insulating film 11 on the active region 3 is about 550 nm after this planarization.

After the planarization of the first interlayer insulating film 11, first, second, and third contact holes 11a, 11b, 11c are formed on the first, second, and third n-type impurity diffusion layers 7a, 7b, 7c in the active region 3 respectively by patterning the covering film 10 and the first interlayer insulating film 11 by virtue of the photolithography method. Then, a titanium (Ti) film of 20 nm thickness and a titanium nitride (TiN) film of 50 nm thickness are formed in sequence on the first interlayer insulating film 11 and in the first, second, and third contact holes 11a, 11b, 11c by the sputter. Then, a tungsten (W) film is formed on the TiN film by the CVD method. As a result, the tungsten film is completely filled in the first, second, and third contact holes 11a, 11b, 11c.

Then, the tungsten film, the titanium nitride film, and the titanium film are polished by the CMP method until an upper surface of the first interlayer insulating film 11 is exposed. Accordingly, the titanium film, the titanium nitride film, and the tungsten film left in the first, second, and third contact holes 11a, 11b, 11c are used as first, second, and third conductive plugs 12a, 12b, 12c respectively.

Then, a silicon oxide nitride (SiON) film 13 of 120 nm thickness is formed on the first interlayer insulating film 11 and the first, second, and third conductive plugs 12a, 12b, 12c by the CVD method using the silane and ammonia. This silicon oxide nitride film 13 is formed to prevent the oxidation of the first, second, and third conductive plugs 12a, 12b, 12c.

Next, steps required to form the capacitor shown in FIG. 6B will be explained with reference to FIGS. 7B to 7E, hereunder.

As shown in FIG. 7B, a titanium film of 10 to 30 nm thickness and a platinum film of 100 to 300 nm thickness are formed in sequence on the SiON film 13 by the DC sputter method, whereby a first conductive film 14 having a double-layered structure is formed. As the first conductive film 14, a film made of iridium, ruthenium, ruthenium oxide, iridium oxide, strontium ruthenium oxide, or the like may be formed.

Then, PZT (Plumbum Zirconate Titanate) of 100 to 300 nm thickness is formed on the first conductive film 14 as a ferroelectric film 15 by the RF sputter method. As ferroelectric material, there are PLZT (Plumbum Lanthanum Zirconate Titanate), $SrBi_2(Ta_xNb_{1-x})_2O_9$, $Bi_4Ti_2O_{12}$, etc. in addition to PZT.

Then, as the crystallizing process of the ferroelectric film 15, for example, the RTA (Rapid Thermal Annealing) process is carried out at the temperature of 750° C. for 60 seconds in the oxygen atmosphere.

Then, a platinum film of 100 to 300 nm thickness is formed as a second conductive film 16 on the ferroelectric film 15 by the DC sputter method. As the second conductive film 16, iridium oxide or strontium ruthenium oxide may be employed.

Then, as shown in FIG. 7C, capacitor upper electrodes 16a are formed by patterning the second conductive film 16 in the memory cell area A by virtue of the photolithography method. As shown in FIG. 6B, the upper electrode 16a is formed in the area between the Y-direction active regions 3 and between the X-direction active regions 3. Accordingly, a plurality of upper electrodes 16a are arranged right and left alternatively (in zigzag) along the Y direction. The ferroelectric film 15 that is damaged by the patterning of the upper electrodes 16a is annealed at 650° C. for 60 minutes in the oxygen atmosphere, whereby the film quality of the ferroelectric film 15 is recovered.

Then, the ferroelectric film 15 is patterned by the photolithography method in the memory cell area A. Thus, as shown in FIG. 6B, the ferroelectric film 15 has a planar shape that is formed along the arrangement of a plurality of upper electrodes 16a aligned in the Y direction and that is formed like a continuous S-shape in the Y direction to avoid the active regions 3.

After the ferroelectric film 15 is patterned, as shown in FIG. 7D, an encap layer 17 made of insulating material such as PZT, PLZT, $Al_2O_3$, etc. and having a thickness of 20 nm is formed on the upper electrodes 16a, the ferroelectric film 15, and the first conductive film 14. The encap layer 17 is formed to prevent the reduction of the ferroelectric film 15.

Then, as shown in FIG. 7E, shapes that are the same continuous S-shape in the Y direction as the pattern shape of the ferroelectric film 15 but are a size larger than the ferroelectric film 15 are formed by patterning the encap layer 17 and the first conductive film 14 by means of the photolithography method. The patterned first conductive film 14 acts as the plate line, i.e., the capacitor lower electrode 14a.

Then, The ferroelectric film 15 that is damaged by the patterning of the lower electrodes 14a is annealed at 650° C. for 60 minutes in the oxygen atmosphere, whereby the film quality of the ferroelectric film 15 is recovered.

As a result, one capacitor C is constructed by one upper electrodes 16a, the underlying ferroelectric film 15, and the lower electrodes 14a in the memory cell area A.

A reference capacitor $C_R$ is also formed simultaneously with the formation of the capacitor C in the reference cell area B. As shown in FIG. 6B, the reference capacitor $C_R$ comprises a plurality of upper electrodes 16b that are formed on prolonged lines of respective active regions 3 in the X direction by patterning the second conductive film 16, the ferroelectric films 15 that are patterned like an almost stripe shape to pass under a plurality of upper electrodes 16b in the Y direction, and lower electrodes 14b that have the almost same shape as the ferroelectric films 15 formed by patterning the first conductive film 14.

The upper electrodes 16b and the ferroelectric films 15 of the reference capacitor $C_R$ are also covered with the encap layer 17. Also, in order to improve the film quality, the ferroelectric films 15 constituting the reference capacitor $C_R$ are annealed in the oxygen atmosphere after the formation of the upper electrodes 16b and after the formation of the lower electrodes 14b respectively.

Figure 7F:
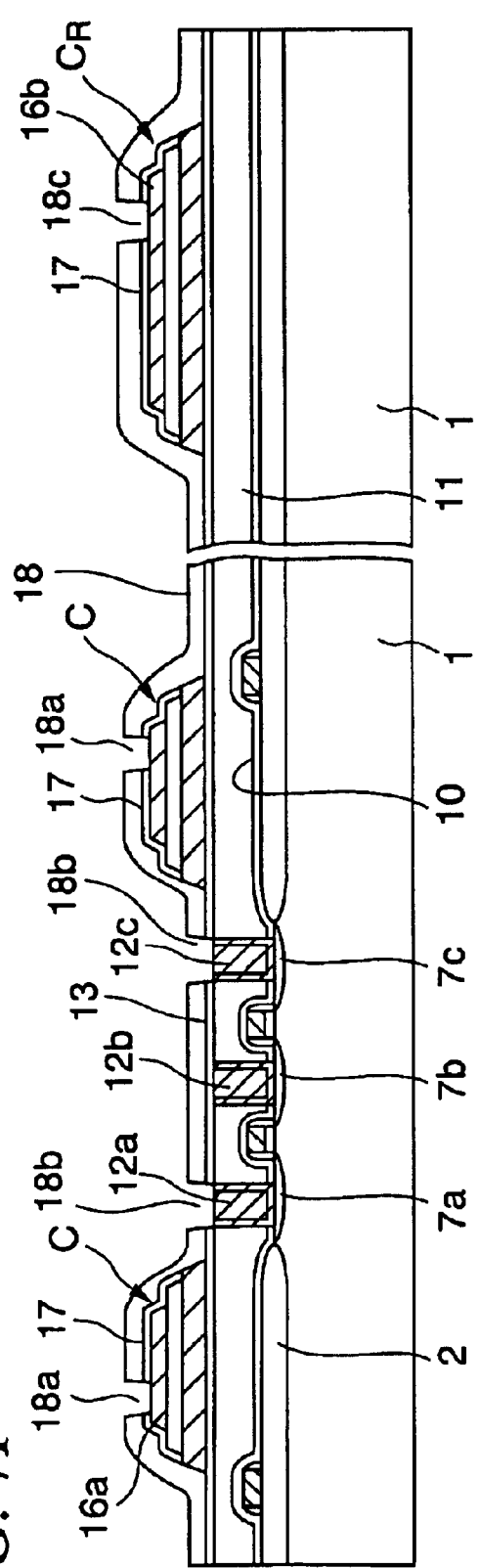

Then, as shown in FIG. 7F, a second interlayer insulating film 18 made of $SiO_2$ is formed on the encap layer 17 and the silicon oxide nitride film 13 to have a thickness of 265 nm. The $SiO_2$ is formed by the CVD method using TEOS, for example.

Then, the second interlayer insulating film 18 is patterned by virtue of the photolithography method. Thus, first holes 18a are formed on a part of the upper electrodes 16a of the capacitors C, second holes 18b are formed on the first and third conductive plugs 12a, 12c on both sides of the active region 3, and also a third hole 18c is formed on a part of the upper electrode 16b of the reference capacitor $C_R$.

The first holes 18a and the second holes 18b in the memory cell area A are formed on a straight line in the Y direction, as shown in FIG. 6C. Also, the third holes 18c in the reference cell area B is formed on a prolonged line of the active region 3 in the X direction.

After this, the film quality of the ferroelectric film 15 is recovered from the damage applied when the first, second, and third holes 18a, 18b, 18c are formed, by heating the resultant structure at the temperature of 500 to 650° C. for 30 to 120 minutes in the oxygen atmosphere.

Then, a titanium nitride film of 125 nm thickness is formed in the first, second, and third holes 18a, 18b, 18c and on the second interlayer insulating film 18 by the sputter method.

Figure 7G:
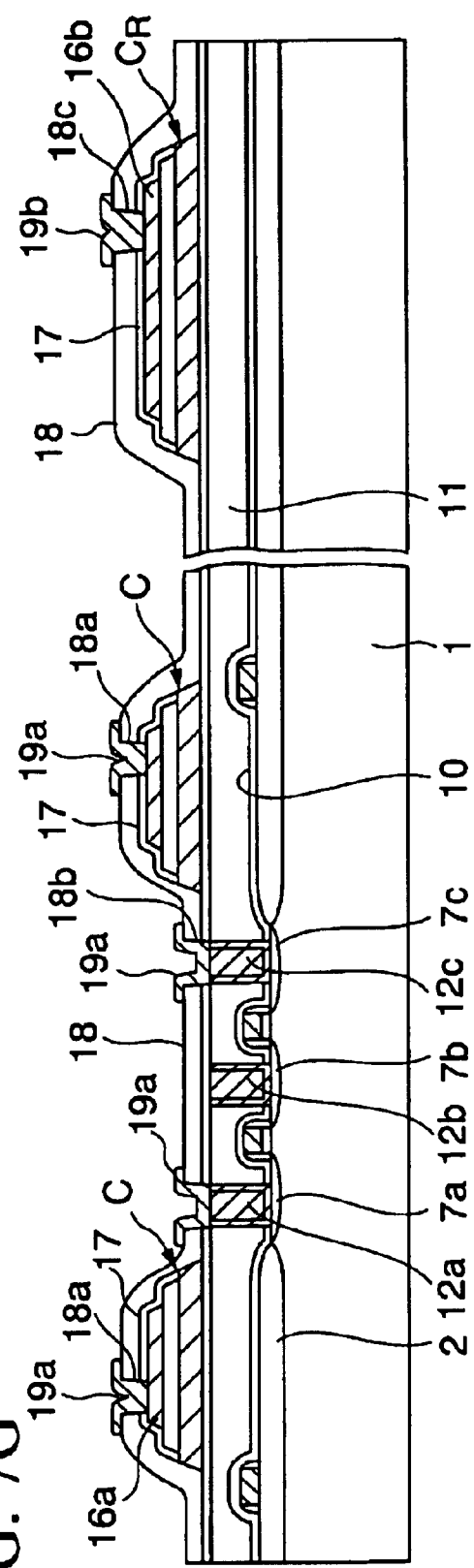

Then, as shown in FIG. 6C and FIG. 7G, the titanium nitride film is patterned by virtue of the photolithography method. Thus, local-interconnection wirings (local interconnections) 19a each connects one first contact hole 18a and one second contact hole 18b both positioned adjacently in the Y direction are formed in the memory cell area A, and also local-interconnection wirings 19b are formed in the areas, each of which extends from the third hole 18c to the bit-line arrangement portion prior to the adjacent third hole 18c, in the reference cell area B.

As a result, the impurity diffusion layers 7a or 7c of the MOS transistors T and the upper electrodes 16a of the capacitors C are connected electrically in the memory cell area A.

Figure 7H:
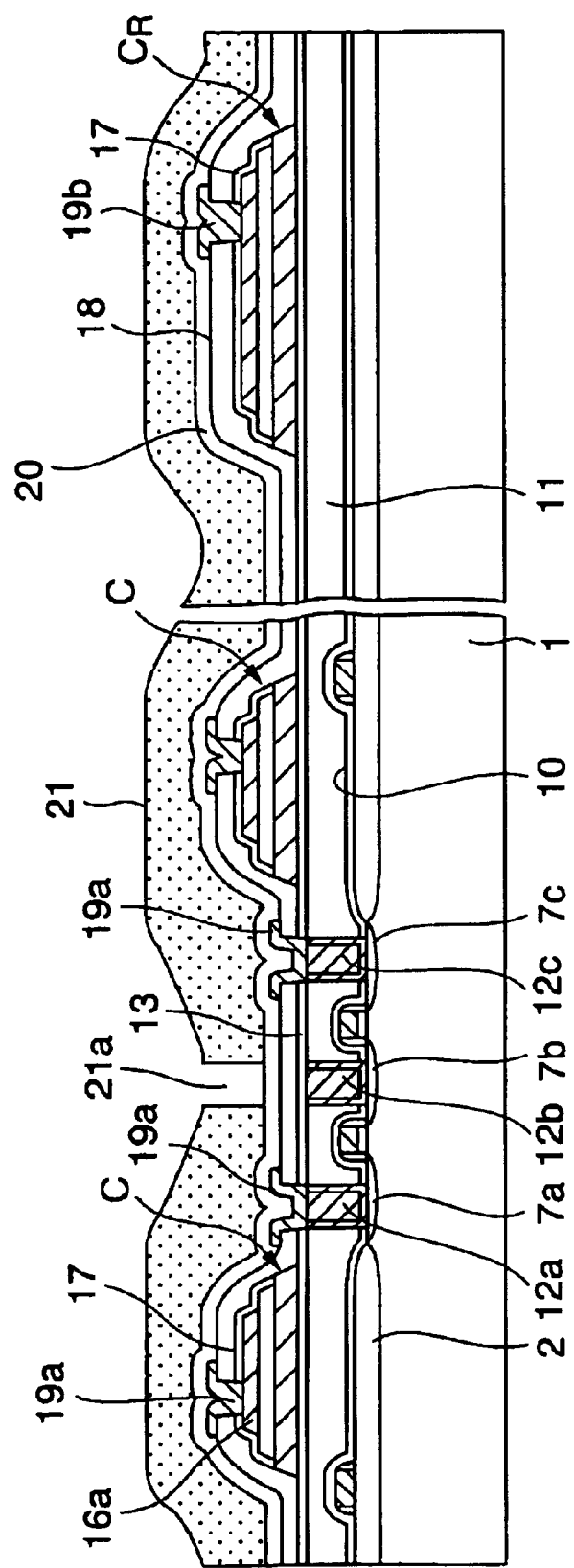

Then, as shown in FIG. 7H, an $SiO_2$ film of 300 nm thickness, for example, is formed on the local-interconnection wirings 19a, 19b and the second interlayer insulating film 18 by the plasma CVD method using TEOS. This SiO$_2$ film is employed as a third interlayer insulating film 20. Then, by coating resist 21 on the third interlayer insulating film 20 and then exposing/developing the resist, a first window 21a is formed over the second conductive plug 12b in the center of the active region 3 in the memory cell area A, and also a second window (not shown) is formed at the portion of the local-interconnection wiring 19b, which is protruded from the reference capacitor C$_R$ and through which the bit line is passed, in the reference cell area B.

Figure 7I:
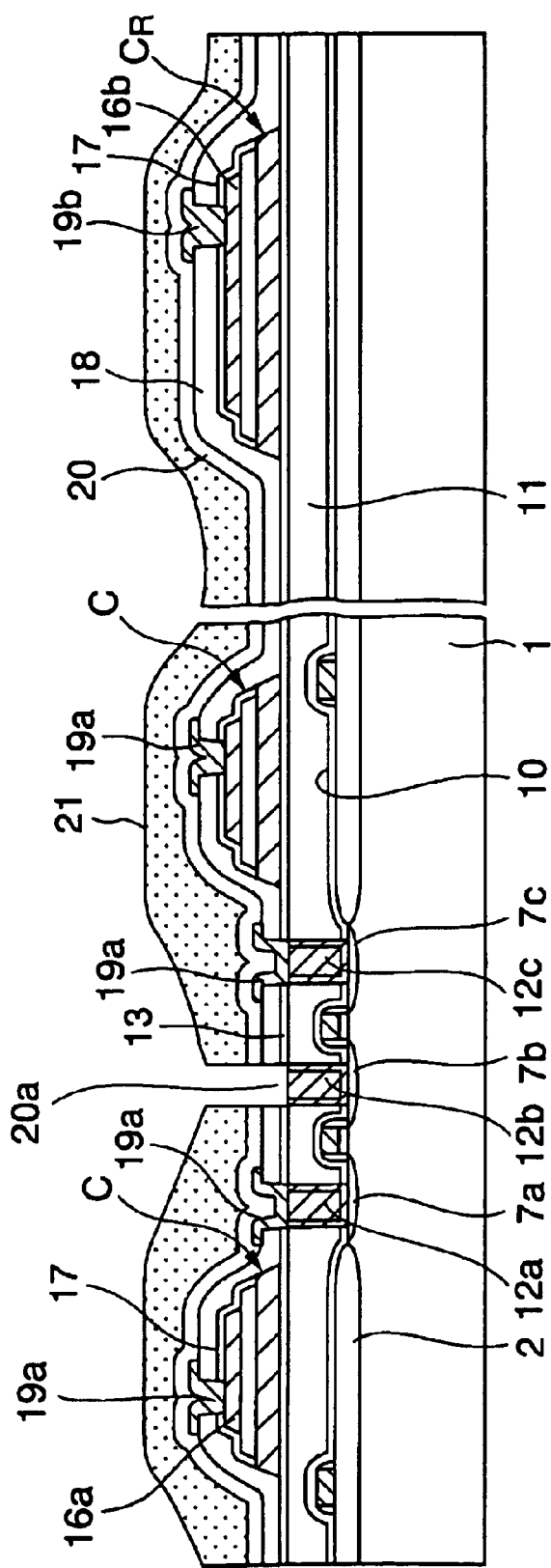

Then, as shown in FIG. 6D and FIG. 7I, the third interlayer insulating film 20, the second interlayer insulating film 18, and the SiON film 13 are etched through the first window 2Ia in the memory cell area A while using the resist 21 as a mask. Thus, an upper contact hole 20a is formed on the second conductive plug 12b. At the same time, as shown in FIG. 6D and FIG. 7I, a via hole 20b is formed on the local-interconnection wiring 19b by etching the third interlayer insulating film 20 through the second window (not shown) in the reference cell area B.

At the time of this etching, there is the possibility that the third interlayer insulating film 20 is exposed near the large level difference portion of the reference capacitor C$_R$ because of the reduction in thickness of the resist 21 and then the third interlayer insulating film 20 is etched to expose a part of the local-interconnection wiring 19b. In this first embodiment, the third interlayer insulating film 20 is brought into the state that such film is prevented from being exposed.

Figure 7J:
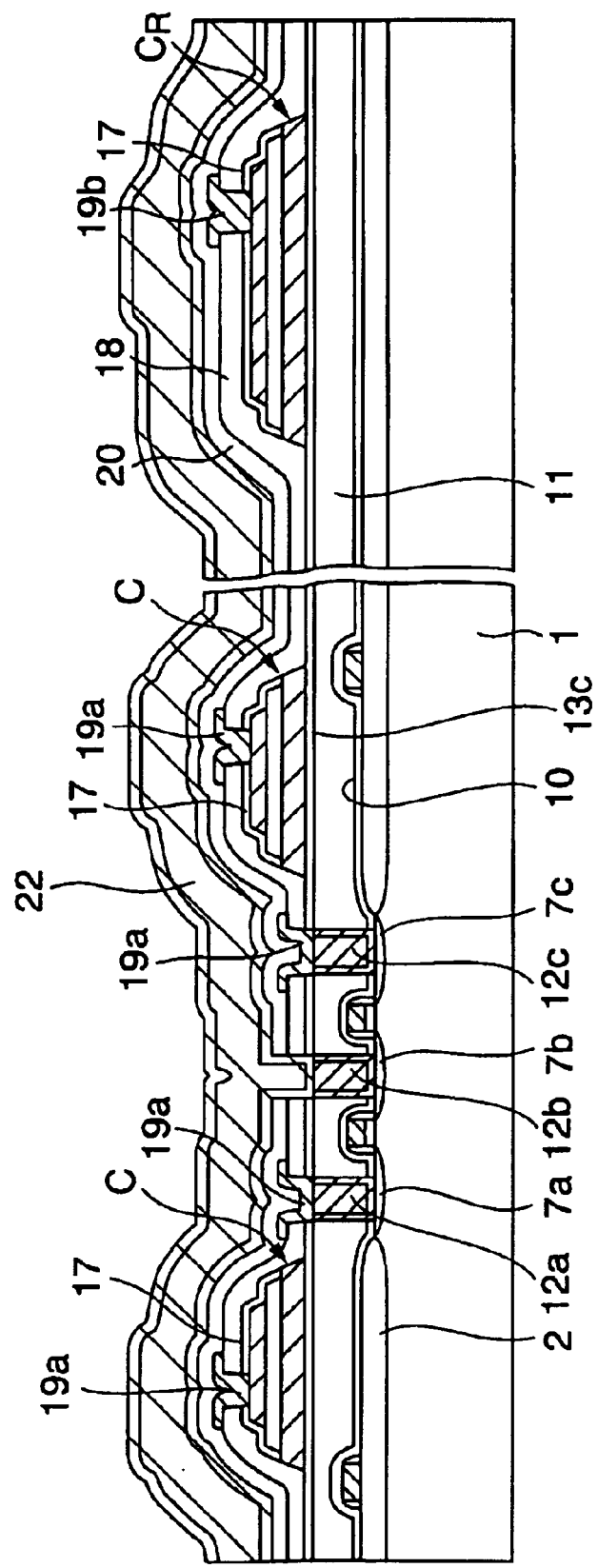

Then, the resist 21 is removed. Then, an underlying metal film made of titanium and titanium nitride, an aluminum film, and a titanium nitride film are formed sequentially on the third interlayer insulating film 20 and in the upper contact hole 20a and the via hole 20b to get a total thickness of 800 nm. As shown in FIG. 6D and FIG. 7J, bit lines 22 passing over a plurality of active regions 3 that are aligned in the X direction are formed by patterning these metal films.

The bit lines 22 are formed at positions that pass through over the reference capacitors C$_R$ in the reference cell area B, and are connected to the local-interconnection wirings 19b via the via holes 20b. Also, the bit lines 22 are connected electrically to the impurity diffusion layers 7b in the center of the active regions 3 via the upper contact holes 20a and the second conductive plugs 12b in the memory cell area A. In addition, each of the bit lines 22 extends over the capacitor C and the active region 3 in the X direction and overlaps with a part of the local-interconnection wiring 19a in the memory cell area A.

Figure 7K:
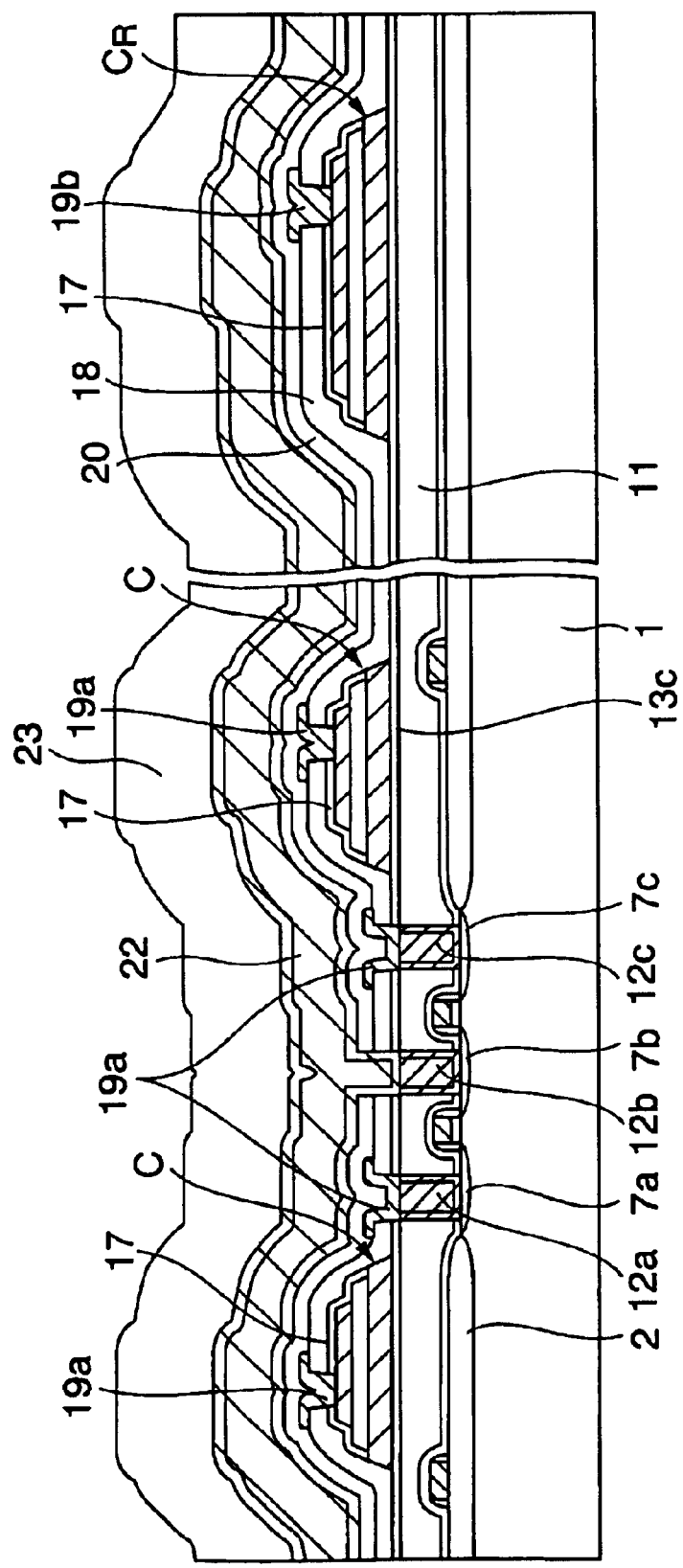

Then, as shown in FIG. 7K, the SiO$_2$ film is formed on the bit lines 22 and the third interlayer insulating film 20 by the plasma CVD method using TEOS, and this SiO$_2$ film is used as a fourth interlayer insulating film 23.

Figure 8:
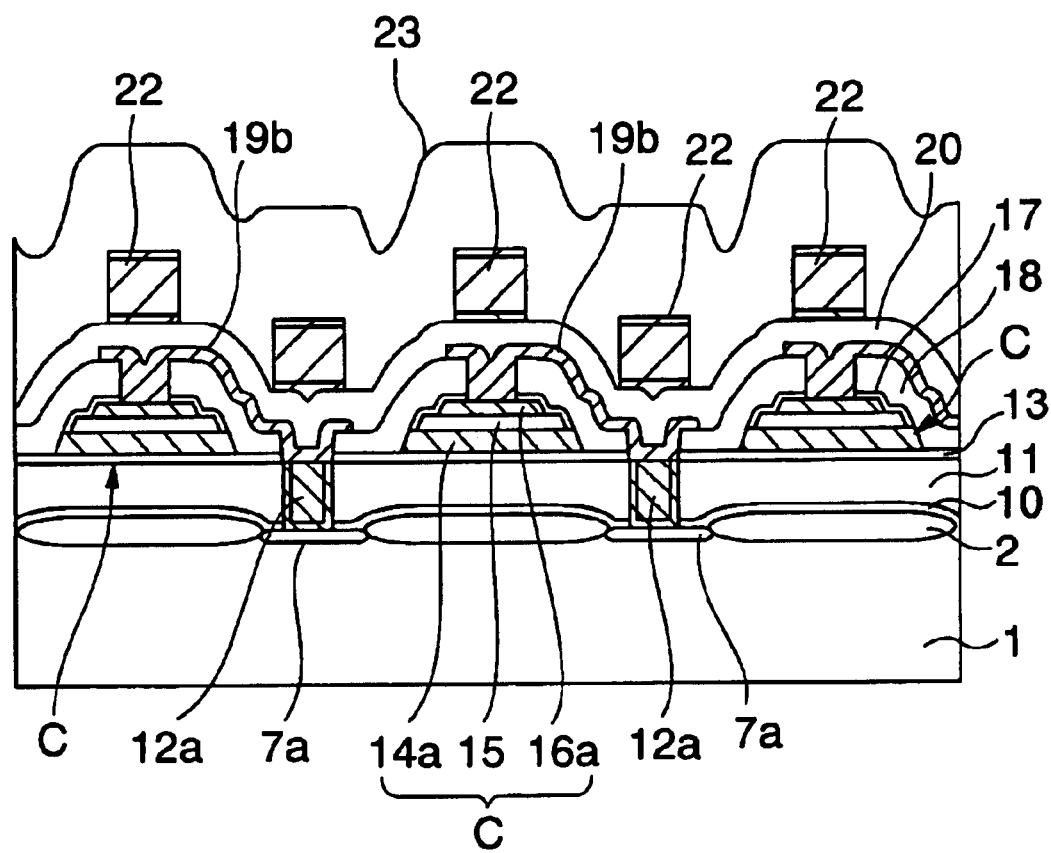
FIG. 8 is a sectional view taken along a IV—IV line in FIG. 9.

In this case, a sectional shape taken along a VI—VI line in FIG. 6D is shown in FIG. 8.

Then, although not shown particularly, the FeRAM formation goes through the steps of planarizing an upper surface of the fourth interlayer insulating film 23 by the CMP method, then forming an overlying wiring, etc., whereby the FeRAM forming steps are completed.

As described above, according to the present embodiment, the local-interconnection wirings 19a for connecting the upper electrodes 16a of the capacitors C and the impurity diffusion layers 7a or 7c of the MOS transistors T are extended in the direction that orthogonally intersects with the extension direction of the bit lines 22 in the memory cell area A. Therefore, mutually opposing areas between in the memory cell area A and the bit lines 22 can be reduced rather than the prior art. As a result, the parasitic capacitance formed by the local-interconnection wiring 19a and the bit line 22 can be reduced smaller than the prior art, and therefore it is possible to permit the operation of the FeRAM at the higher speed than the prior art.

Meanwhile, in FIG. 6D, if a length L$_2$ of each local-interconnection wiring 19a in the X direction in the memory cell area A is assumed as 1.1 µm, an overlapping length of the local-interconnection wiring 19a on the capacitor C and on the MOS transistor T both located adjacently in the X direction, that overlaps with the bit line 22, is 2.2 µm. Then, if a width of the bit line 22 in the Y direction is assumed as 1 µm, an opposing area between the bit line 22 and two underlying local-interconnection wirings 19a is 2.2 µm$^2$. In other words, the overlapping area between the local-interconnection wiring 19a that connects one capacitor C and one MOS transistor T and the bit line 22 is 2.2 µm$^2$.

Figure 3:
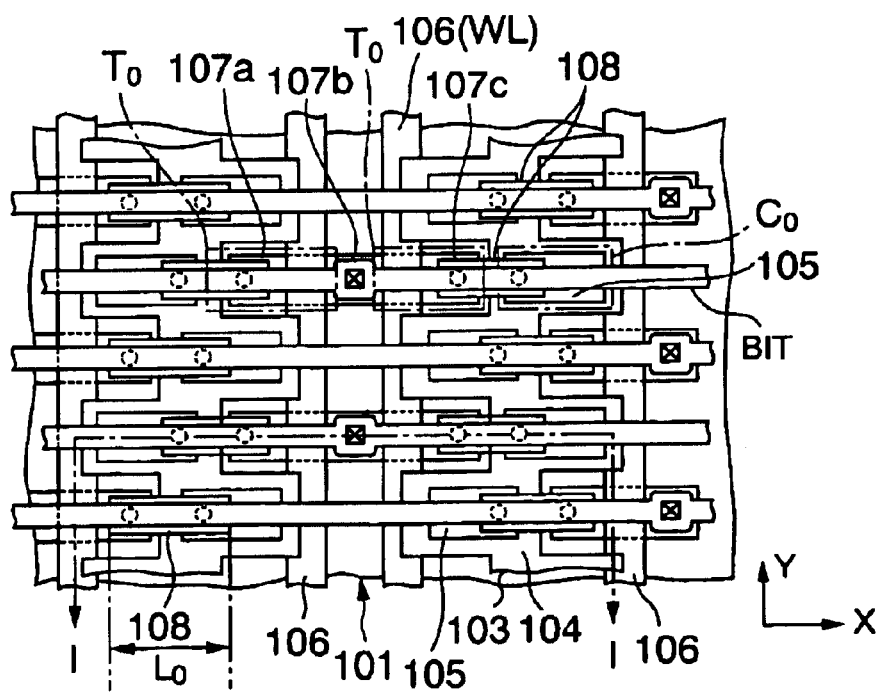
FIG. 3 is a plan view showing the 1T1C type FeRAM memory cell in the prior art.
Figure 4B:
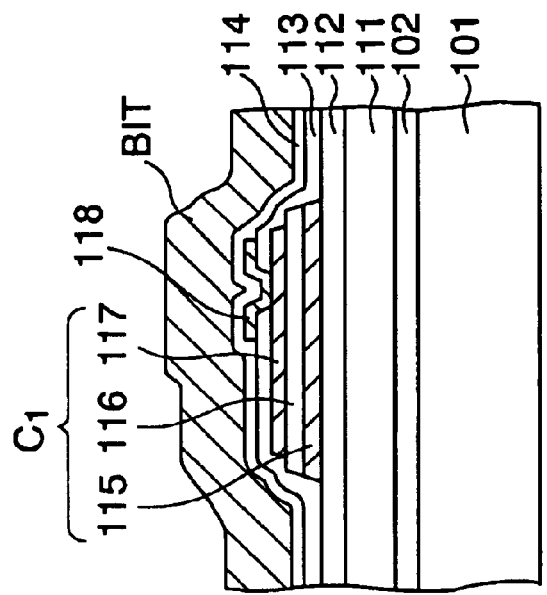
FIG. 4B is a sectional view showing a reference capacitor in the prior art.
Figure 4A:
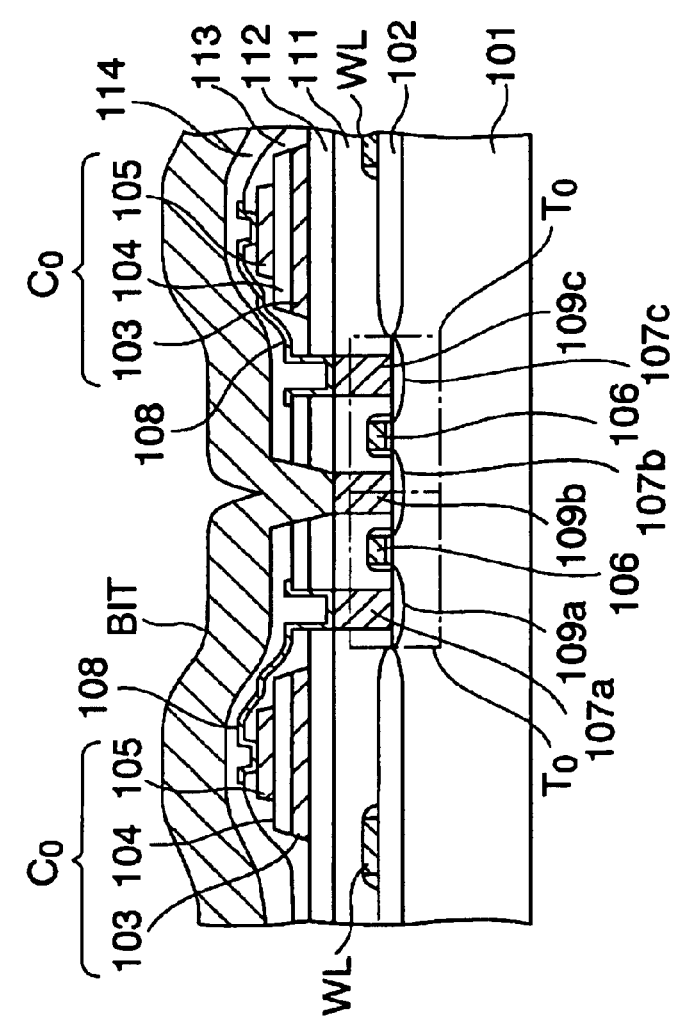
FIG. 4A is a sectional view showing the 1T1C type FeRAM memory cell in the prior art.
Figure 5A:
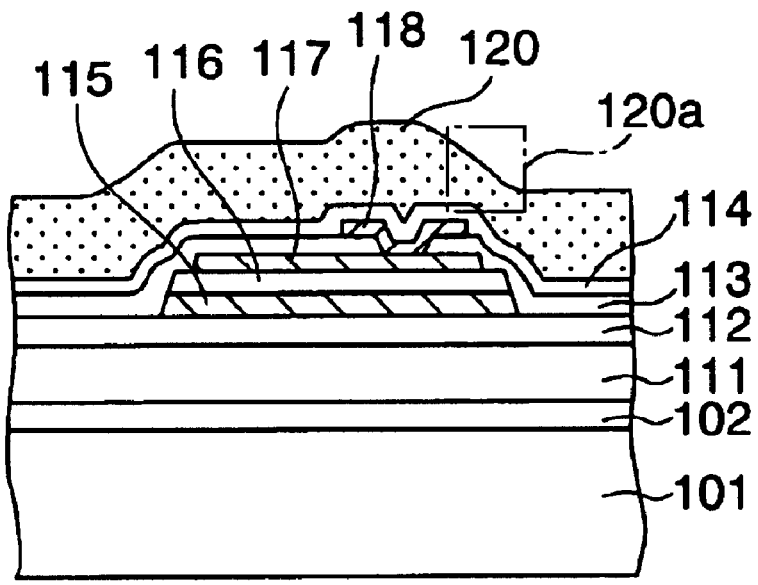
FIG. 5A is a sectional view showing the state that resist is coated on the reference capacitor in the prior art.
Figure 5B:
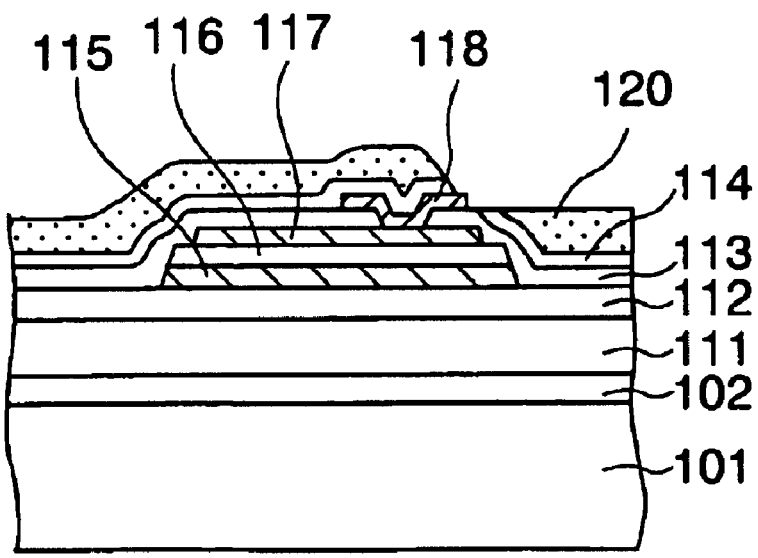
FIG. 5B is a sectional view showing the state that the resist coated on the reference capacitor in the prior art is etched.

In contrast, in the prior art structure shown in FIG. 3, if a length L$_o$ of the local-interconnection wiring 108 in the X direction in the memory cell area A is assumed as 3.1 µm, an overlapping length of the local-interconnection wiring 108 on the capacitor C$_o$ and on the MOS transistor T$_o$ both located adjacent in the X direction, that overlaps with the bit line BIT, is 3.1 µm. Then, if a width of the bit line BIT is assumed as 1 µm, the opposing area between the bit line BIT and the local-interconnection wiring 108 is 3.1 µm Accordingly, the parasitic capacitance formed by the local-interconnection wiring 19a and the bit line 22 in the first embodiment can be reduced by 29% and into 71% of the parasitic capacitance in the prior art structure shown in FIG. 3.

(Second Embodiment)

In the first embodiment, three sides of the first and third plugs 12a, 12c on the active region 3 are surrounded by the capacitors C in the memory cell area A.

For this reason, as shown in FIG. 6C, there is the possibility that the local-interconnection wiring 19a that extends from the upper electrode 16a of the capacitor C to the area over the active region 3 is narrowed as described in the following.

Figure 9A:
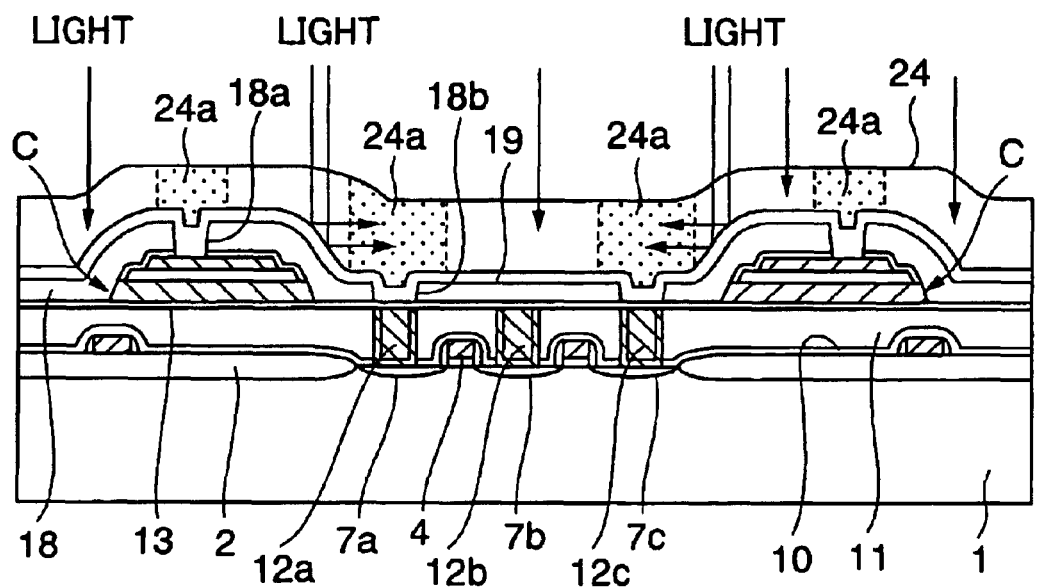
FIGS. 9A and 9B are sectional views showing the state that a resist pattern is thinned in steps of forming the FeRAM memory cell.

FIG. 9A shows the state that, in order to form the local-interconnection wiring 19a, positive resist 24 is coated on a titanium nitride film 19 after the titanium nitride film 19 of 125 nm thickness is formed on the second interlayer insulating film 18 and in the holes 18a, 18b by the sputter.

In the exposure step, the light is irradiated onto the positive resist 24 except a local-interconnection wiring forming portion 24a. This light is reflected by the titanium nitride film 10, that is inclined on the side of the capacitor, to enter into the local-interconnection wiring forming portion 24a and cause the halation.

Figure 9B:
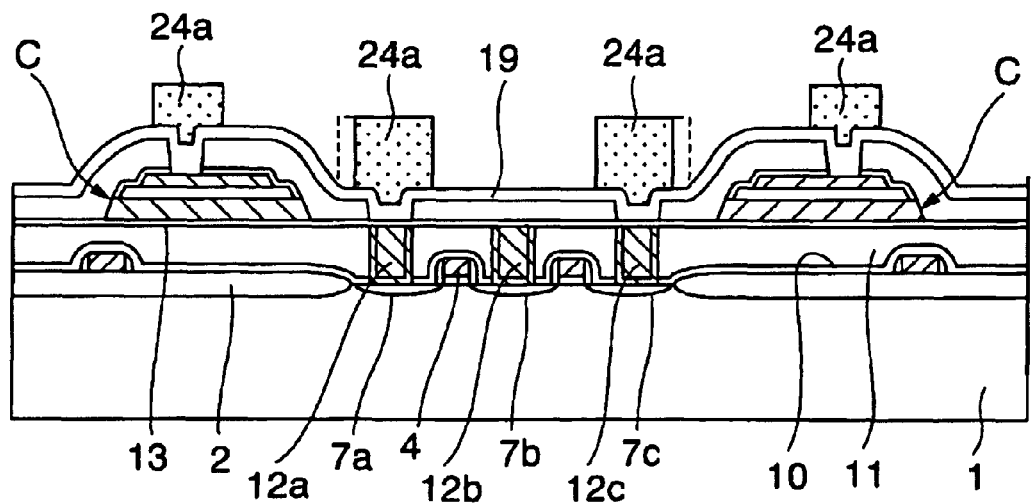
Figure 10:
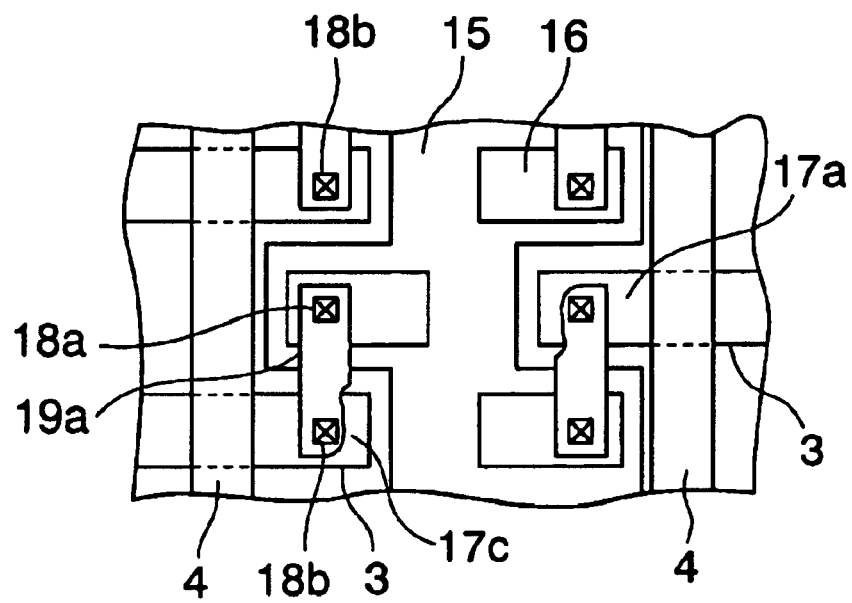
FIG. 10 is a plan view showing the state that a local-interconnection wiring is narrowed in steps of forming the FeRAM memory cell.

Then, if the positive resist 24 is developed, the local-interconnection wiring forming portion 24a to be essentially left is narrowed, as shown in FIG. 9B. Then, if the local-interconnection wiring 19a is formed by etching the titanium nitride film 19 while using the developed positive resist 24 as a mask, such local-interconnection wiring 19a is also narrowed over the active region 3 and its neighboring area, as shown in FIG. 10.

Figure 11:
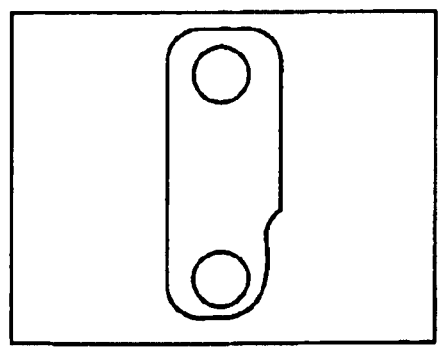
FIG. 11 is a plan view showing the state that the local-interconnection wiring of the FeRAM memory cell is narrowed.

Since the reduction in width of the local-interconnection wiring 19a causes the connection failure or the increase of the wiring resistance, such reduction in width is not preferable. FIG. 11 is a plan view depicted based on a SEM photograph in which the local-interconnection wiring 19a is narrowed.

Figure 12A:
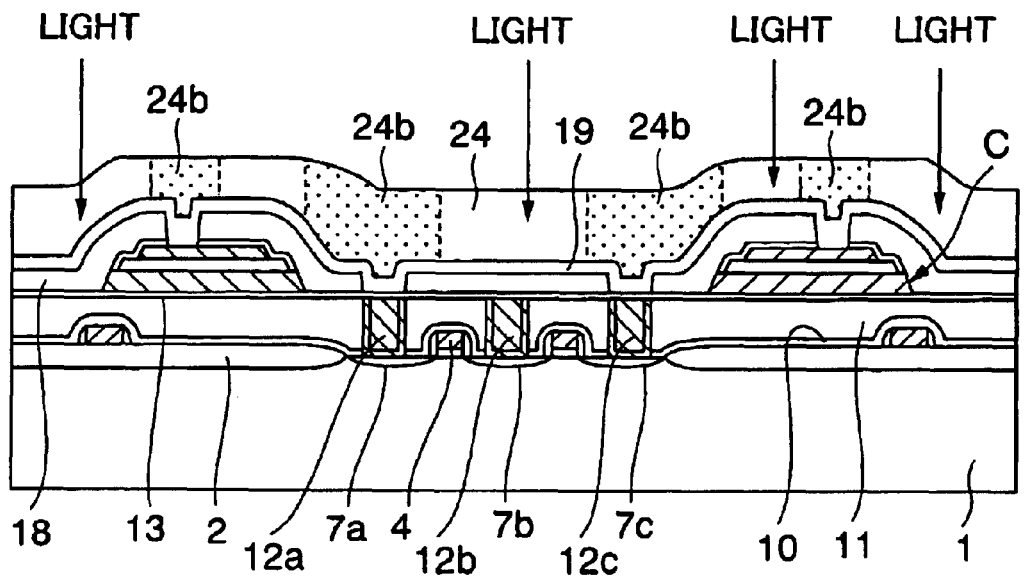
FIGS. 12A and 12B are sectional views showing steps of forming an FeRAM memory cell according to a second embodiment of the present invention.
Figure 12B:
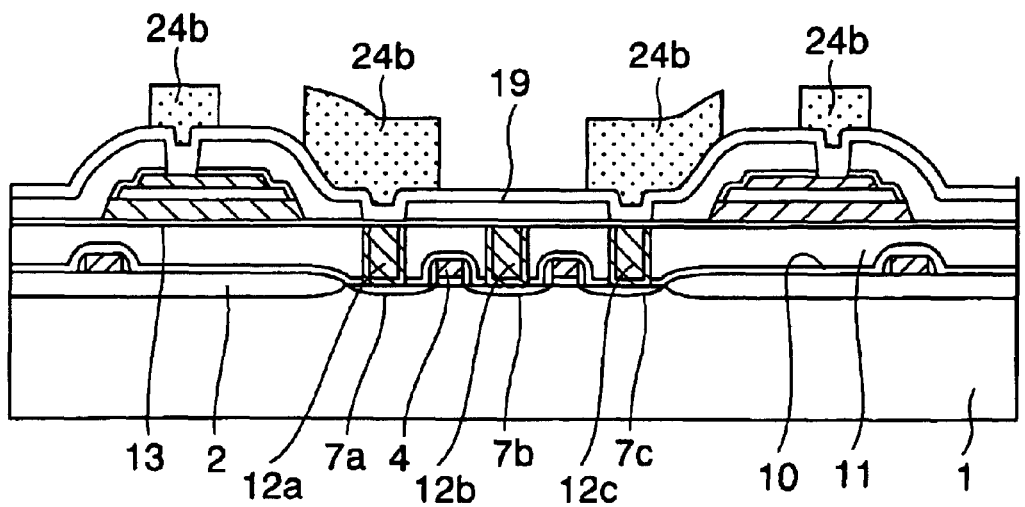

Therefore, in order to prevent the reduction in width of the local-interconnection wiring 19a, as shown in FIG. 12A, a local-interconnection wiring forming portion 24b that is extended up to the inclined surface of the titanium nitride film 19 located in the area between the active area 3 and the capacitor C is designed, the reflection of the exposure light at the inclined surface can be prevented. Thus, as shown in FIG. 12B, the reduction in width of the local-interconnection wiring forming portion 24b in the resist 24 is not generated after the positive resist 24 is developed.

Figure 14:
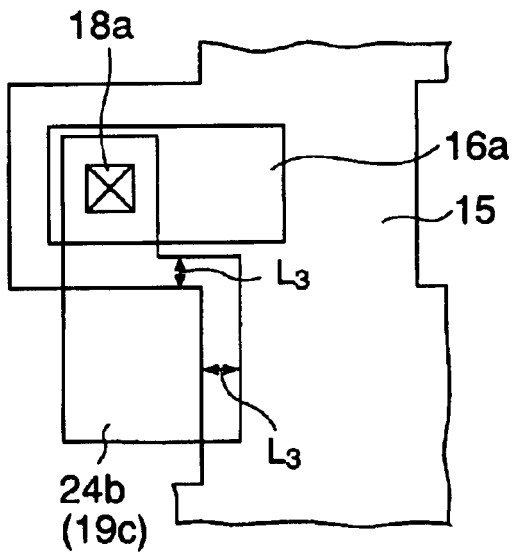
FIG. 14 is a plan view showing an arrangement of the local-interconnection wiring of the FeRAM memory cell and a capacitor according to the second embodiment of the present invention.

The local-interconnection wiring forming portion 24b should be extended at least to the inclined surface of the titanium nitride film 19 on the side of the capacitor C. For example, an overlapping width $L_3$ of the local-interconnection wiring forming portion 24b with the lower electrode 14a is set to about 0.2 µm, as shown in FIG. 14.

Figure 13:
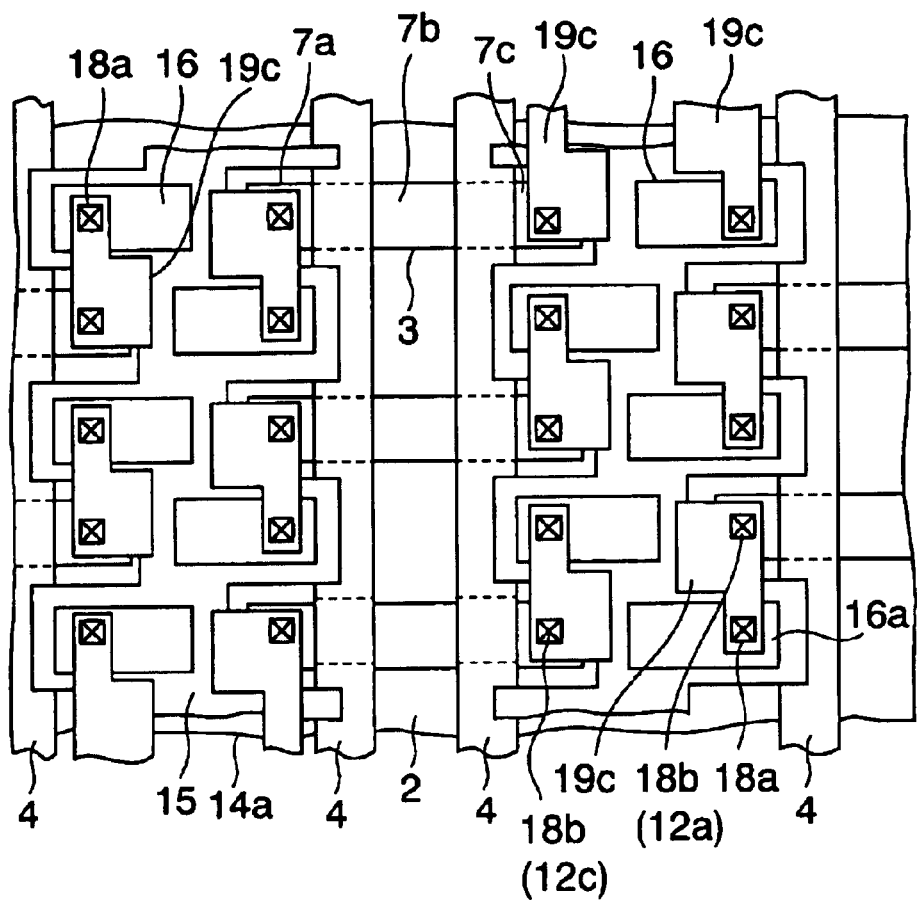
FIG. 13 is a plan view showing the state that local-interconnection wirings of the FeRAM memory cell according to the second embodiment of the present invention are formed.

If the titanium nitride film 19 is etched while using the local-interconnection wiring forming portion 24b of the resist 24 as a mask, local-interconnection wiring 19c having an extended portion that is on the lower electrode 14a of the capacitor C located in two directions from the first or third conductive plug 12a or 12c on the active region 3 are formed, as shown in FIG. 13. The reason for that the extended portion of the local-interconnection wiring 19c do not extend to the three directions to three of the capacitors C, the fixed interval is required between the local interconnection wirings. If such interval can be sufficiently assured, the local-interconnection wiring 19c may be extended on the edge portion of the lower electrode 14a to the three directions.

Figure 15:
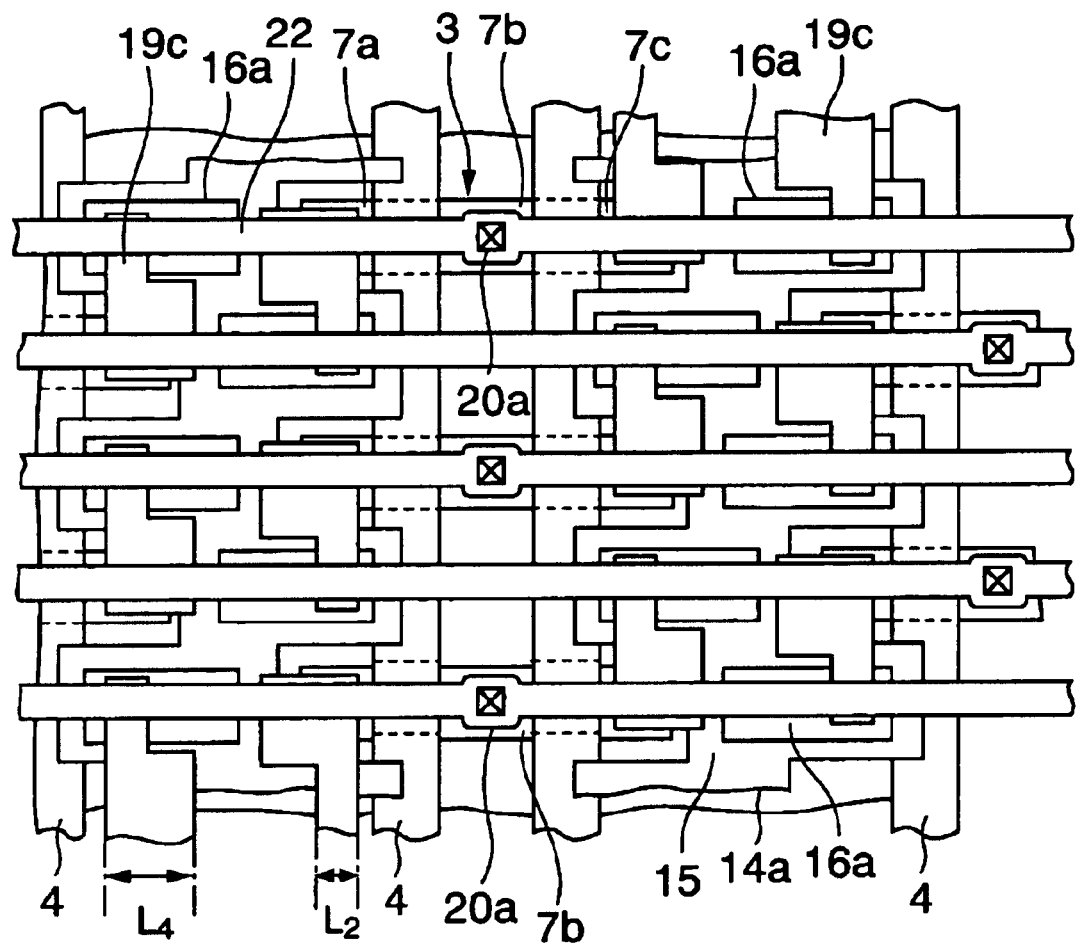
FIG. 15 is a plan view showing the state that bit lines of the FeRAM memory cell according to the second embodiment of the present invention are formed.

By the way, if a width of the local-interconnection wiring 19c is expanded, an opposing area between the bit line 22 and the local-interconnection wiring 19c is increased, as shown in FIG. 15. In this case, a length $L_4$ in the extended direction of the bit line 22 is increased up to about 1.7 µm, for example. If this increased amount is considered, the parasitic capacitor consisting of the local-interconnection wiring 19c and the bit line 22 can be reduced into about 90% of the prior art.

(Third Embodiment)

As shown in FIG. 7I, in the step of forming the upper contact hole 20a on the second conductive plug 12b, the resist 21 is thinned near the large level difference portion of the reference capacitor $C_R$ in the peripheral area of the chip and the third interlayer insulating film 20 is ready to expose.

Figure 16:
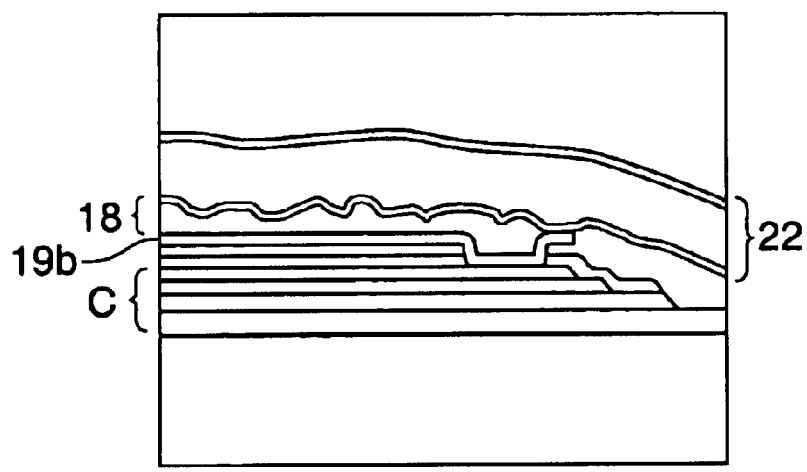
FIG. 16 is a sectional view showing a short-circuit state between the local-interconnection wiring of the reference capacitor of the FeRAM and the bit line.

If the third interlayer insulating film 20 is etched to expose a part of the local-interconnection wiring 19b, a short-circuit between the local-interconnection wiring 19b and the overlying bit line 22 is caused, as shown in FIG. 16. In this case, FIG. 16 is a sectional view that is depicted based on the SEM photograph.

Figure 17:
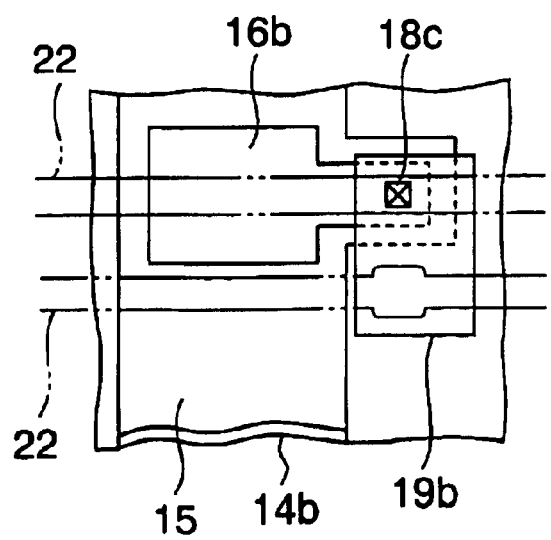
FIG. 17 is a plan view showing a connection state of a reference capacitor of an FeRAM according to a third embodiment of the present invention and the local-interconnection wiring.
Figure 18:
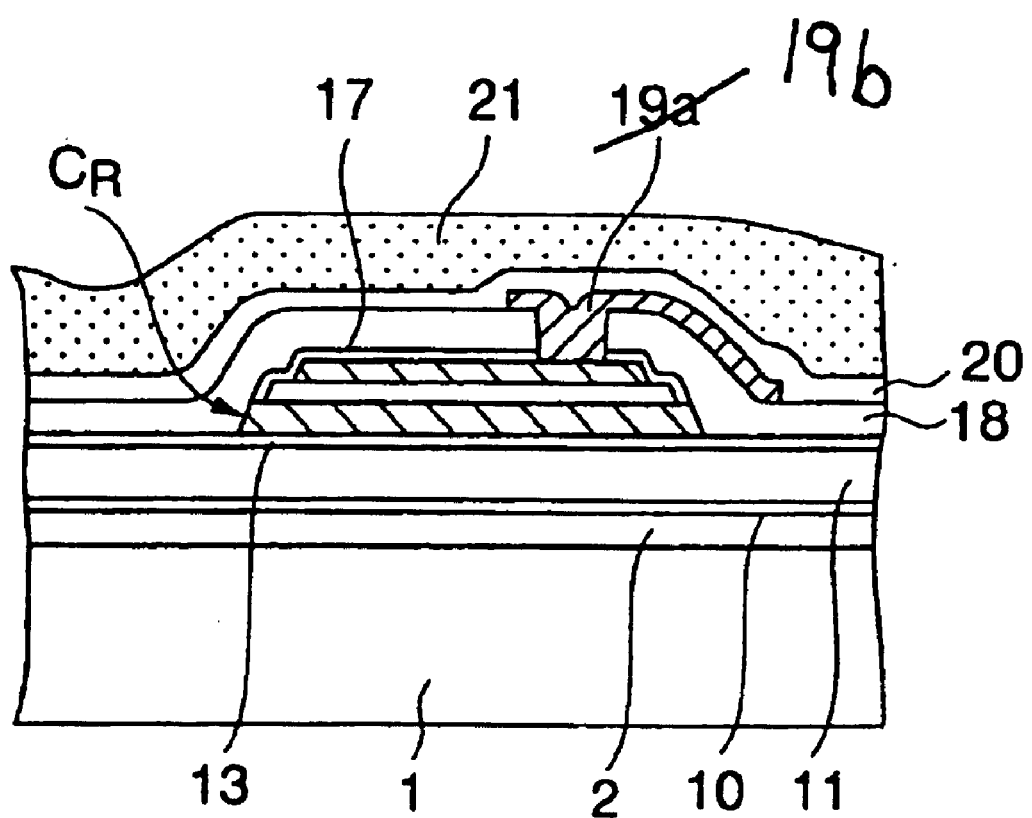
FIG. 18 is a sectional view showing the connection state of the reference capacitor of the FeRAM according to the third embodiment of the present invention and the local-interconnection wiring.

In order to prevent such short-circuit between the local-interconnection wiring 19b and the overlying bit line 22, as shown in FIG. 17 and FIG. 18, if the local-interconnection wiring 19b is formed to have a shape that is protruded from the reference capacitor $C_R$ in the extending direction of the bit line 22 (in the X direction), the thinning of the resist near the local-interconnection wiring 19b can be avoided and in turn the etching of the third interlayer insulating film 20 near the local-interconnection wiring 19b can be prevented.

As shown in FIG. 18, it is preferable that the local-interconnection wiring 19b should be extended onto the inclined surface of the second interlayer insulating film 18 on the side of the reference capacitor $C_R$.

As described above, according to the present invention, the switching element and the capacitance are connected by the first wiring extending in the first direction, and extended directions of the first wiring and the second wiring are intersected with each other by extending the second wiring, that is formed on the switching element and the capacitance, in the second direction that intersects with the first direction. Therefore, the opposing area between the first wiring and the second wiring can be reduced rather than the prior art, and also the capacitance consisting of the first wiring and the second wiring can be reduced rather than the prior art.

Also, since the resist coated on the capacitor and the switching element is designed at the level difference portion of the capacitor not to irradiate the exposure light, the wiring-forming resist pattern on the switching element is extended up to the level difference portion of the capacitor. Therefore, since the halation due to the level difference is hard to occur, the reduction in thickness of the resist pattern can be eliminated and thus the generation of the wiring failure can be prevented.

In addition, according to the present invention, the wiring connected to the upper electrode of the reference capacitor, that is formed in the chip peripheral portion of the semiconductor memory device, is extended to the outside of the reference capacitance in the area where the reduction in thickness of the resist appears. Therefore, the underlying level difference of the resist is relaxed to be smooth, and thus the thinning of the resist caused by the level difference of the reference capacitor can be suppressed.

What is claimed is:

1. A semiconductor device comprising:
   switching elements formed on a semiconductor substrate;
   capacitors formed in areas between the switching elements, said switching elements and said capacitors distributed in a first direction, each of the capacitors having a lower electrode, a dielectric film, and an upper electrode;
   a first wiring for connecting the upper electrode of each of the capacitors to each of the switching elements, said first wiring extending in the first direction, and including a first connecting portion connected to the capacitor, and a second connecting portion connected to the switching element, said first connecting portion and said second connecting portion being provided along the first direction; and
   a second wiring formed over a part of the first wiring, each of the switching elements, and each of the capacitors, said second wiring extending in a second direction that intersects with the first direction.

2. A semiconductor device according to claim 1, wherein respective upper electrodes of the capacitors are formed to deviate right and left alternatively in the first direction, and the lower electrode is continuously formed in the first direction under the upper electrodes.

3. A semiconductor device according to claim 1, wherein the second wiring is connected electrically to the switching element.

4. A semiconductor device according to claim 1, wherein the dielectric film is formed of a ferroelectric material.

5. A semiconductor device according to claim 1, wherein each switching element is a transistor having a gate electrode formed on the semiconductor substrate via a gate insulating film, and impurity diffusion regions formed in the semiconductor substrate on both sides of the gate electrode.

6. A semiconductor device according to claim 5, wherein the gate electrode is a word line, and the second wiring is a bit line.

7. A semiconductor device according to claim 1, wherein each of the switching elements is surrounded by the capacitors.

8. A semiconductor device according to claim 1, wherein the first wiring is extended from an area over the switching element to an area outside in the second direction.

9. A semiconductor device according to claim 1, wherein the first wiring is formed on an insulating film for covering the capacitor and the switching element, and the first wiring is extended to overlie the insulating film on a side of the capacitor.

10. A semiconductor device according to claim 1, wherein the first wiring has a shape in which a first area on the upper electrode is narrower than a second area on the switching element.

11. A semiconductor device having a memory cell area in which a ferroelectric capacitor and a switching element that are connected mutually and electrically via a first wiring are formed, and a reference cell area in which a reference capacitor that is connected to the switching element via a second wiring and consist of a lower electrode, a ferroelectric film and an upper electrode is formed, the semiconductor device comprising: an insulating film which covers the reference capacitor and in which a hole is formed on the upper electrode; and a third wiring which is connected to the upper electrode via the hole, is extended to connect to the second wiring in a first direction, and have a shape protruded from the reference capacitor in a second direction that is different from the first direction.

12. A semiconductor device according to claim 11, wherein a portion of the third wiring, that protrude from the reference capacitor in the second direction, cover an inclined surface of the insulating film on a side of the reference capacitor.

13. A semiconductor device comprising:
a transistor formed on a semiconductor substrate and having a pair of impurity diffusion layers;
a capacitor formed on a semiconductor substrate and having a lower electrode, a dielectric film and an upper electrode;
a first wiring electrically connecting the upper electrode of the capacitor to one of the pair of impurity diffusion layers of the transistor, and extending in a first direction, and including a first connecting portion connected to the capacitor, and a second connecting portion connected to the transistor, said first connecting portion and said second connecting portion being provided along the first direction; and
a second wiring formed over the capacitor, and extending in a second direction that intersects with the first direction.

14. A semiconductor device according to claim 13, wherein the second wiring is electrically connected to another of the pair of impurity diffusion layers of the transistor.

15. A semiconductor device according to claim 13, wherein the dielectric film is formed of ferroelectric material.

16. A semiconductor device according to claim 13, wherein the second wiring is a bit line.

* * * * *